(12) United States Patent
Arima

(10) Patent No.: US 8,300,755 B2
(45) Date of Patent: Oct. 30, 2012

(54) TIMING RECOVERY CIRCUIT, COMMUNICATION NODE, NETWORK SYSTEM, AND ELECTRONIC DEVICE

(75) Inventor: Yukio Arima, Osaka (JP)

(73) Assignee: Panasonic Corporation, Osaka (JP)

( * ) Notice: Subject to any disclaimer, the term of this patent is extended or adjusted under 35 U.S.C. 154(b) by 539 days.

(21) Appl. No.: 12/602,751

(22) PCT Filed: Nov. 30, 2007

(86) PCT No.: PCT/JP2007/073177
§ 371 (c)(1),
(2), (4) Date: Dec. 2, 2009

(87) PCT Pub. No.: WO2008/152755

PCT Pub. Date: Dec. 18, 2008

(65) Prior Publication Data

US 2010/0177790 A1    Jul. 15, 2010

(30) Foreign Application Priority Data

Jun. 11, 2007   (JP) ................... 2007-154144

(51) Int. Cl.
*H04L 7/00*    (2006.01)
(52) U.S. Cl. ........ 375/355; 375/259; 375/360; 327/141; 327/165; 327/291

(58) Field of Classification Search .......... 375/354–356, 375/360, 326–327, 259–260, 316; 327/24, 327/37, 165–166, 141, 291
See application file for complete search history.

(56) References Cited

U.S. PATENT DOCUMENTS

| 6,496,555 B1 * | 12/2002 | Soda ............................. 375/376 |
| 2001/0038675 A1 * | 11/2001 | Zortea et al. ................. 375/376 |
| 2003/0081712 A1 | 5/2003 | Takada |

FOREIGN PATENT DOCUMENTS

| JP | 09-238129 | 9/1997 |
| JP | 11-317732 | 11/1999 |
| JP | 2003-134096 | 5/2003 |

* cited by examiner

*Primary Examiner* — Jean B Corrielus
(74) *Attorney, Agent, or Firm* — McDermott Will & Emery LLP

(57) ABSTRACT

A comparison period determiner (110) detects whether or not a change occurs in received data during a comparison period including a timing at which a rising edge of a reference clock occurs. A phase determiner (120) determines whether a rising edge of the received data is located before or after the reference clock and determines whether a falling edge of the received data is located before or after the reference clock, and outputs a first determination signal and a second determination signal indicating results of the respective determinations. A synchronous data generator (130) outputs a signal having a level depending on a result of the detection by the comparison period determiner (110) and an output of the phase determiner (120), as synchronous data, in synchronization with a synchronization clock.

19 Claims, 23 Drawing Sheets

TIMING RECOVERY CIRCUIT, COMMUNICATION NODE, NETWORK SYSTEM, AND ELECTRONIC DEVICE

RELATED APPLICATIONS

This application is the U.S. National Phase under 35 U.S.C. §371 of International Application No. PCT/JP2007/073177, filed on Nov. 30, 2007, which in turn claims the benefit of Japanese Application No. 2007-154144, filed on Jun. 11, 2007, the disclosures of which Applications are incorporated by reference herein.

TECHNICAL FIELD

The present invention relates to timing recovery circuits which latch data received in data communication in synchronization with a clock signal.

BACKGROUND ART

For example, when communication is performed between devices connected to a network, a receiver device and a transmitter device often have asynchronous clocks and, in addition, different clock frequencies due to different operating environments (e.g., power supply noise, temperature, etc.). Therefore, the receiver device needs to perform synchronization based on received data so as to perform data communication between these devices. This process is commonly called timing recovery, data clock recovery or the like.

In typical timing recovery, a clock is generated in a receiver, a phase difference between the clock and received data is detected, and the frequency or phase of the clock is adjusted, depending on the detected phase difference, thereby generating a clock having a phase appropriate for data reception. Thereafter, the clock thus adjusted is used to latch data to perform data reception. Also, by continually and repeatedly performing the clock adjustment, the phase of the clock is always adjusted to an ideal position even if the phase of received data varies, whereby avoiding violation of a setup constraint and a hold constraint of a flip-flop which receives data.

There is an example of a timing recovery circuit which performs such timing recovery as follows (see, for example, PATENT DOCUMENT 1). Specifically, a determination circuit samples a multiphase clock signal at rising edges of received data, and from the resultant sampled state, determines an optimum sampled clock signal for reproduction of the received data. The sampled clock signal is supplied via a clock select circuit to a sampling circuit. Thereafter, the sampling circuit latches the received data in accordance with the sampled clock signal supplied from the clock select circuit.

Thus, an optimum clock is selected in view of a relationship between the clock and a transition point of received data, and the received data is latched in synchronization with the clock, whereby data whose phase varies due to jitter or the like can be correctly received.

CITATION LIST

Patent Document

PATENT DOCUMENT 1: Japanese Patent Laid-Open Publication No. 2003-134096

SUMMARY OF THE INVENTION

Technical Problem

However, in the aforementioned timing recovery circuit, the clock which is used in the determination circuit to sample received data, does not necessarily have the same phase as that of a clock which is used in the sampling circuit to latch the received data, which is a problem. This is because the determination circuit and the sampling circuit are physically separated from each other and are also located apart from each other. Specifically, a clock which was determined as having an optimum phase for latching received data by the determination circuit, is likely to deviate from the optimal phase as the clock is actually passed through the clock select circuit before being supplied to the sampling circuit.

This problem can be solved to some extent by carefully designing the layout of a circuit. However, as the communication rate of data increases, the magnitude of a deviation of 1-bit data relatively increases and eventually becomes non-negligible.

The present invention has been achieved in view of the aforementioned problem. It is an object of the present invention to perform a data receiving process on which the result of comparison between phases of received data and a clock is correctly reflected.

Solution to the Problem

To achieve the object, a timing recovery circuit according to an embodiment of the present invention includes a comparison period determiner configured to detect whether or not a change occurs in received data during a comparison period including a timing at which a rising edge of a reference clock occurs, a phase determiner configured to determine whether a rising edge of the received data is located before or after the reference clock and determine whether a falling edge of the received data is located before or after the reference clock, and output a first determination signal and a second determination signal indicating results of the respective determinations, and a synchronous data generator configured to output a signal having a level depending on a result of the detection by the comparison period determiner and an output of the phase determiner, as synchronous data, in synchronization with a synchronization clock.

Advantages of the Invention

According to the present invention, a data receiving process on which the result of comparison of received data and a clock is correctly reflected can be performed.

DESCRIPTION OF REFERENCE CHARACTERS

Figure 1:
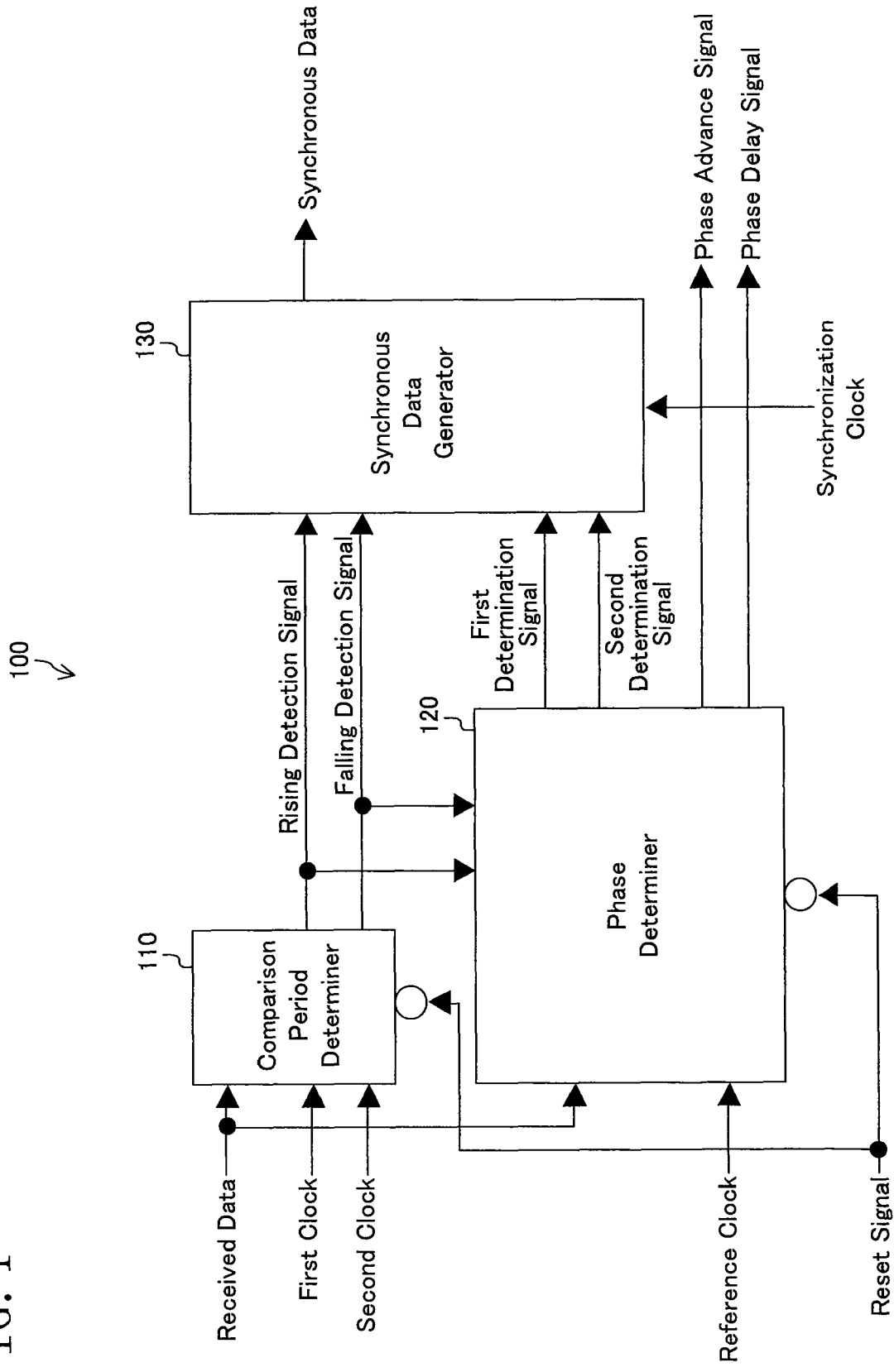
FIG. 1 is a block diagram showing a configuration of a timing recovery circuit 100 according to Embodiment 1.

100 Timing Recovery Circuit
110 Comparison Period Determiner
111-114 Flip-Flop
120 Phase Determiner
121 Rs Latch
122 Rs Latch
130 Synchronous Data Generator
131 Logic Circuit
132 Flip-Flop
200 Timing Recovery Circuit
211-214 Flip-Flop
221 Flip-Flop
222 Selector
300 Timing Recovery Circuit
311-312 Flip-Flop
321-324 Flip-Flop
400 Network System
410 Communication Node
411 Connection Port
412 Timing Recovery Circuit
413 Logic Circuit
420 Network Cable
500 Electronic Device
510 Storage Medium
520 Read Head
530 Analog Frontend
540 Timing Recovery Circuit
550 Logic Circuit

DESCRIPTION OF EMBODIMENTS

Embodiments of the present invention will be described hereinafter with reference to the accompanying drawings. Note that like parts are indicated by like reference characters throughout the specification and their description will not be repeated.

Embodiment 1 of the Invention

FIG. 1 is a block diagram showing a configuration of a timing recovery circuit 100 according to Embodiment 1 of the present invention. The timing recovery circuit 100 is a circuit which outputs received data in synchronization with a synchronization clock. As shown in FIG. 1, the timing recovery circuit 100 includes a comparison period determiner 110, a phase determiner 120, and a synchronous data generator 130.

(Configuration of Comparison Period Determiner 110)

The comparison period determiner 110 receives a first clock and a second clock having different phases, recognizes a period between edges of the first and second clocks as a comparison period, and determines whether or not there is a change in received data. Specifically, when there is a transition point in the received data during the comparison period, the comparison period determiner 110 outputs a rising detection signal and a falling detection signal, depending on the transition direction. The rising detection signal goes H when there is a rising edge of the received data between the edges of the first and second clocks; otherwise, the rising detection signal goes L. Also, the falling detection signal goes H when there is a falling edge of the received data between the edges of the first and second clocks; otherwise, the falling detection signal goes L.

Figure 2:
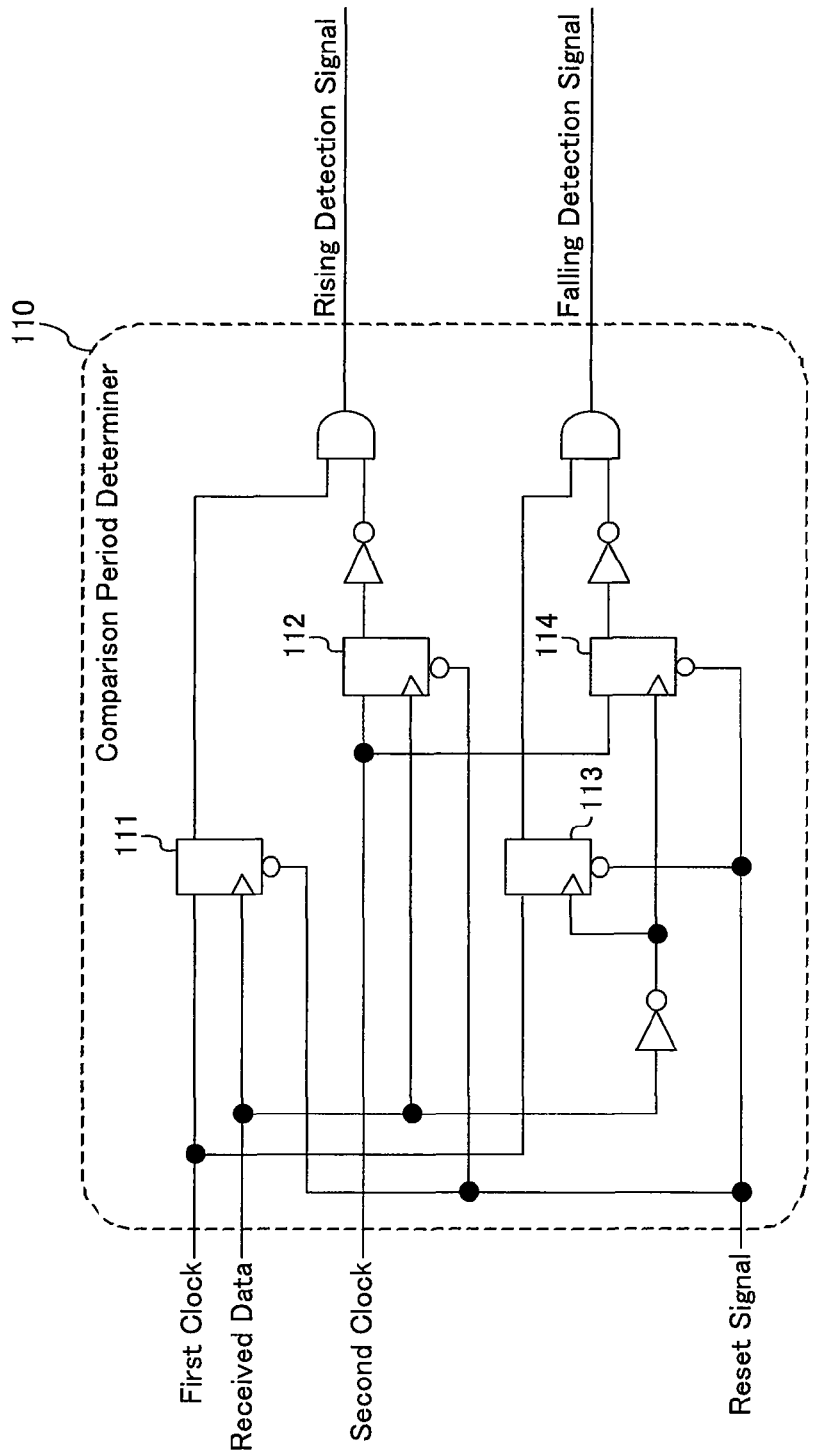
FIG. 2 is a diagram showing an example configuration of a comparison period determiner 110.

The comparison period determiner 110 has a configuration, such as that shown in FIG. 2.

In FIG. 2, flip-flops 111 to 114 capture data in synchronization with a rising edge of a clock. These flip-flops have a reset function to reset their outputs to L when a reset signal is at L.

The flip-flops 111 and 112 capture the first clock and the second clock, respectively, in synchronization with a rising edge of received data. Therefore, when there is a rising edge of received data between an edge of the first clock and an edge of the second clock, the output of the flip-flop 111 goes H, and the output of the flip-flop 112 goes L. In this case, the comparison period determiner 110 outputs the rising detection signal which is at H; otherwise, the comparison period determiner 110 outputs the rising detection signal which is at L.

Note that, in this embodiment, it is desirable that the flip-flops 111 and 112 be reset at any timing after the synchronization clock goes H, and then, the reset state be released immediately before a rising edge of the first clock. In order to most easily realize such a configuration, an inverted signal of the first clock may be used as the synchronization clock, and the first clock may be used as the reset signal. Note that, in this case, a rising edge of the second clock needs to be located before a falling edge of the first clock.

In the description which follows, it is assumed that the reset signal goes L immediately after a rising edge of the synchronization clock, and goes H immediately before a rising edge of the first clock.

The falling detection signal is generated based on the first and second clocks captured by the flip-flops 113 and 114, respectively, as is similar to the rising detection signal. The generation of the falling detection signal is different from that of the rising detection signal in that these flip-flops are operated in synchronization with an inverted signal of received data. As a result, it is determined whether or not there is a falling edge of received data between rising edges of the first and second clocks.

As can be seen from the foregoing, the comparison period determiner 110 defines a rising edge of the first clock and a rising edge of the second clock as a start point and an end point of the comparison period, respectively, and determines whether or not received data has transitioned during the comparison period.

(Configuration of Phase Determiner 120)

The phase determiner 120 receives received data and a reference clock, and determines a phase relationship between the received data and the reference clock. Note that the reference clock has a rising edge during the comparison period.

Specifically, the phase determiner 120 determines whether a transition point of the received data is located before or after the reference clock, and outputs a signal (a first determination signal and a second determination signal described later) depending on the result of the determination. Also, the phase determiner 120 receives the rising detection signal and the falling detection signal output by the comparison period determiner 110, and outputs a phase advance signal and a phase delay signal only when the transition point of the received data is located within the comparison period.

Figure 3:
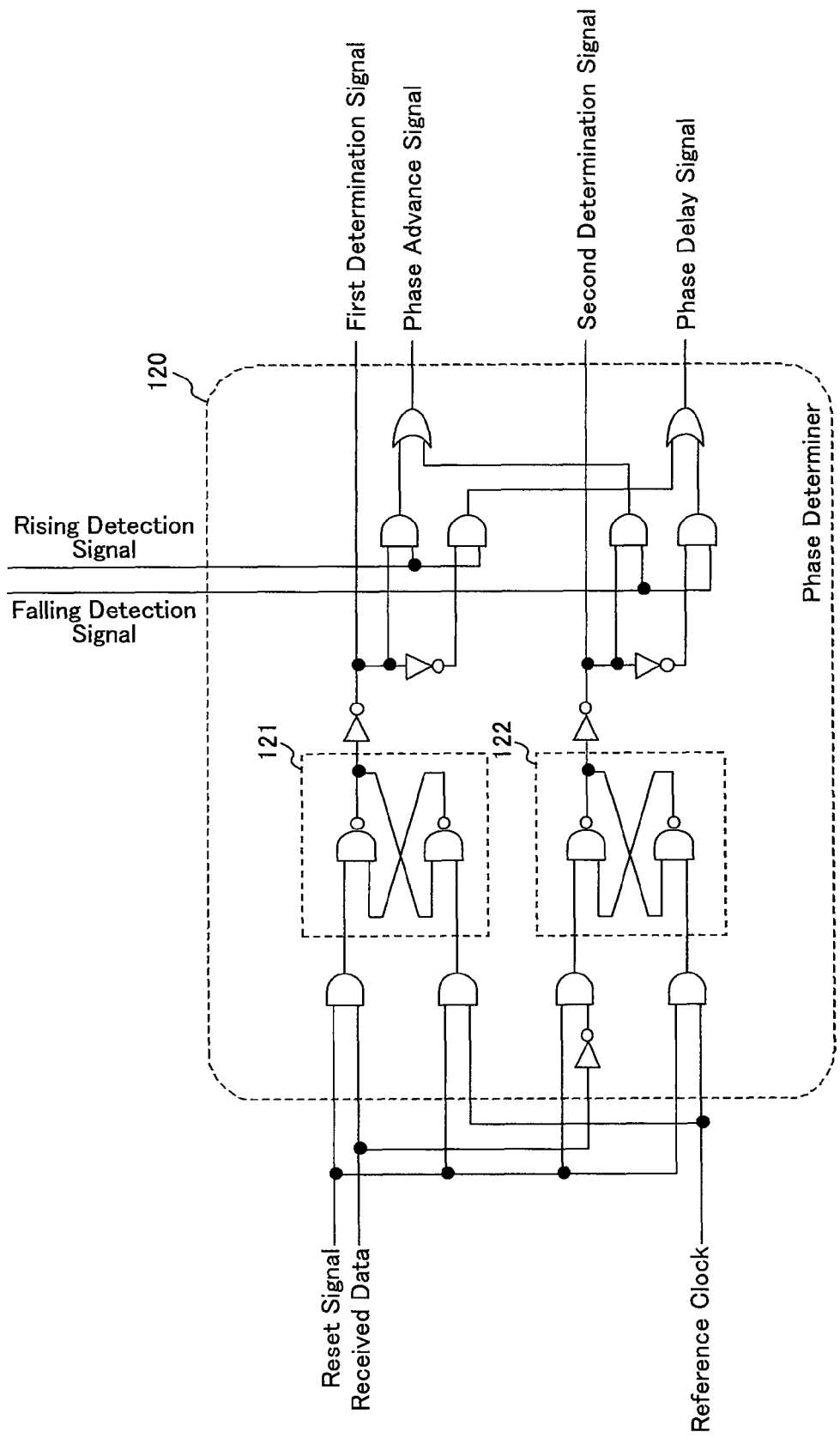
FIG. 3 is a diagram showing an example configuration of a phase determiner 120.

The phase determiner 120 has a configuration, such as that shown in FIG. 3. The phase determiner 120 includes RS latches 121 and 122. The RS latches 121 and 122 are a NAND type RS latch.

The RS latch 121 receives the logical AND of the received data and the reset signal as one input thereof, and the logical AND of the reference clock and the reset signal as the other input thereof. By the logical AND operation, the output of the RS latch 121 is reset to H until immediately before a rising edge of the reset signal, and as a result, a change in the received data before the start of the comparison period is ignored.

When the reset signal goes H, the RS latch 121 receives the received data and the reference clock. If the received data goes H before the reference clock goes H, the RS latch 121 outputs L, and as a result, outputs the first determination signal which is at H. Thereafter, even when the reference clock goes H, the output of the RS latch 121 is maintained until the reset signal goes L.

Conversely, when a rising edge of the reference clock occurs before a rising edge of the received data, the output of the RS latch 121 is fixed to H, and the first determination signal goes L. Also, when a rising edge does not occur in the received data during the comparison period, the first determination signal goes L. By such an operation, the phase determiner 120 determines whether a rising edge of the received data is located before or after the reference clock.

The RS latch 122 performs determination similar to that of the RS latch 121 with respect to an inverted signal of the received data and the reference clock. Specifically, the RS latch 122 determines whether a falling edge of the received data occurs before or after the reference clock, and outputs the second determination signal which is at H when the falling edge of the received data occurs before the reference clock, and the second determination signal which is at L when the falling edge of the received data occurs after the reference clock or when there is no falling edge of the received data.

As described above, the first and second determination signals indicate the results of phase comparison of rising and falling edges of received data, respectively, with a reference clock.

Also, the phase determiner 120 calculates the logical AND of the rising detection signal and the first determination signal, and the logical AND of the falling detection signal and the second determination signal. Thereafter, the phase determiner 120 calculates and outputs the logical OR of the logical ANDs as the phase advance signal. The phase advance signal which is at H means that a transition point of the received data is located before the reference clock during the comparison period. Moreover, the phase determiner 120 calculates the logical AND of an inverted signal of the first determination signal and the rising detection signal, and the logical AND of an inverted signal of the second determination signal and the falling detection signal. Thereafter, the phase determiner 120 calculates and outputs the logical OR of these logical ANDs as the phase delay signal. The phase advance signal which is at H means that a transition point of the received data is located after the reference clock during the comparison period.

(Configuration Synchronous Data Generator 130)

The synchronous data generator 130 receives the rising detection signal, the falling detection signal, the first determination signal, and the second determination signal, generates synchronous data depending on these signals, and outputs the synchronous data in synchronization with the synchronization clock.

Note that the outputs of the comparison period determiner 110 and the phase determiner 120 are reset at the time when the synchronous data is output.

Figure 4:
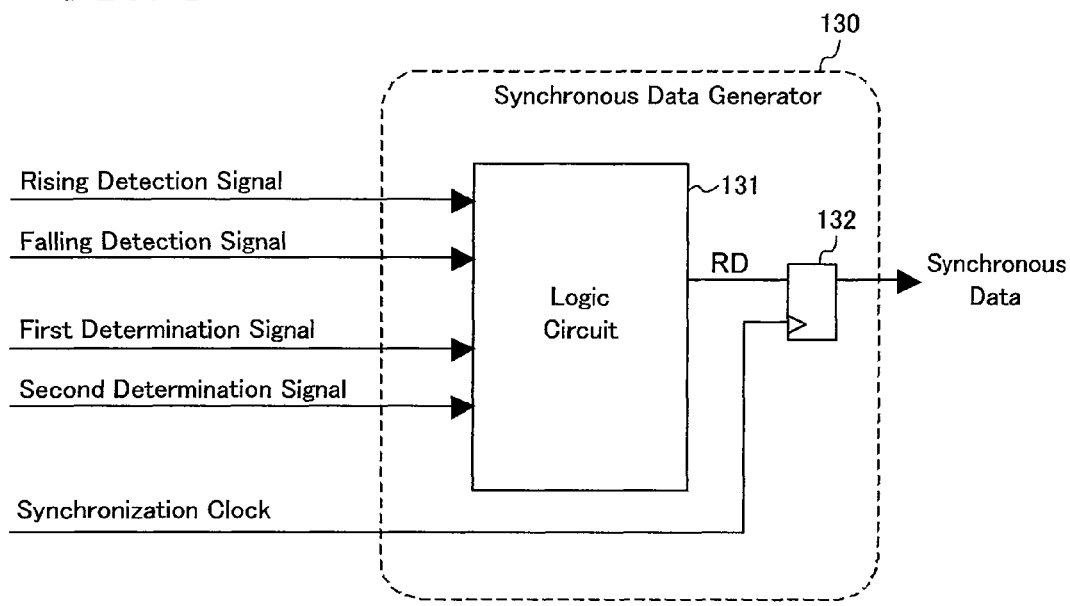
FIG. 4 is a diagram showing an example configuration of a synchronous data generator 130.

The synchronous data generator 130 has a configuration, such as that shown in FIG. 4. In this example, the synchronous data generator 130 includes a logic circuit 131 and a flip-flop 132.

Figure 5:
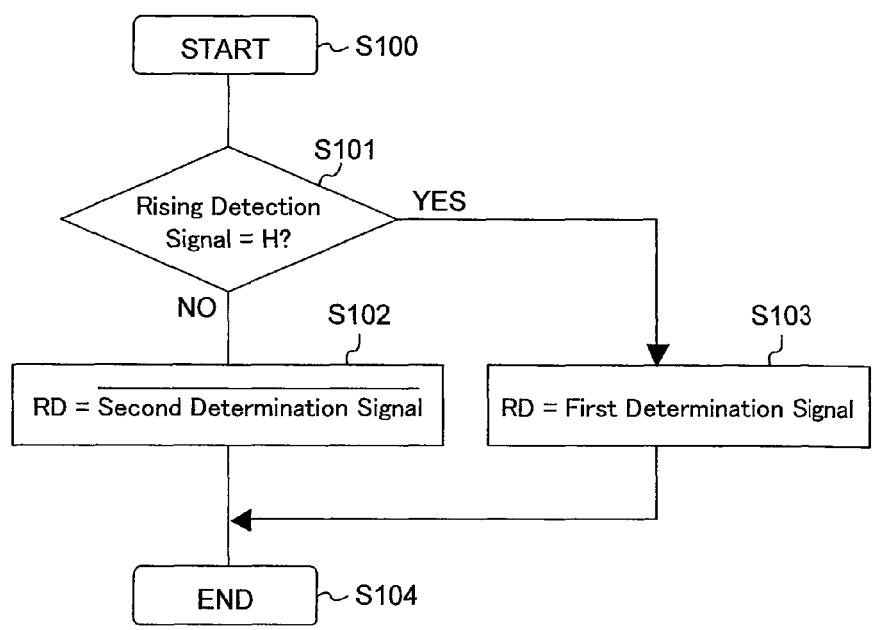
FIG. 5 is a flowchart for describing generation of RD by a logic circuit 131.

The logic circuit 131 generates an output (RD) based on the output of the comparison period determiner 110 and the output of the phase determiner 120. Specifically, the logic circuit 131 generates RD in accordance with a flowchart shown in FIG. 5. As shown in FIG. 5, a process starts from step S100. In step S101, the logic circuit 131 determines whether or not the rising detection signal is at H. When the rising detection signal is at H, the logic circuit 131 outputs the first determination signal as RD in step S103. On the other hand, when determining in step S101 that the rising detection signal is at L, the logic circuit 131 outputs an inverted signal of the second determination signal as RD.

The flip-flop 132 outputs RD in synchronization with the synchronization clock.

According to the aforementioned configuration, the synchronous data generator 130, when the phase determiner 120 detects a change in received data, generates as synchronous data a signal having a level depending on the first and second determination signals, and outputs the signal in synchronization with the synchronization clock.

(Operation of Timing Recovery Circuit 100)

Figure 6:
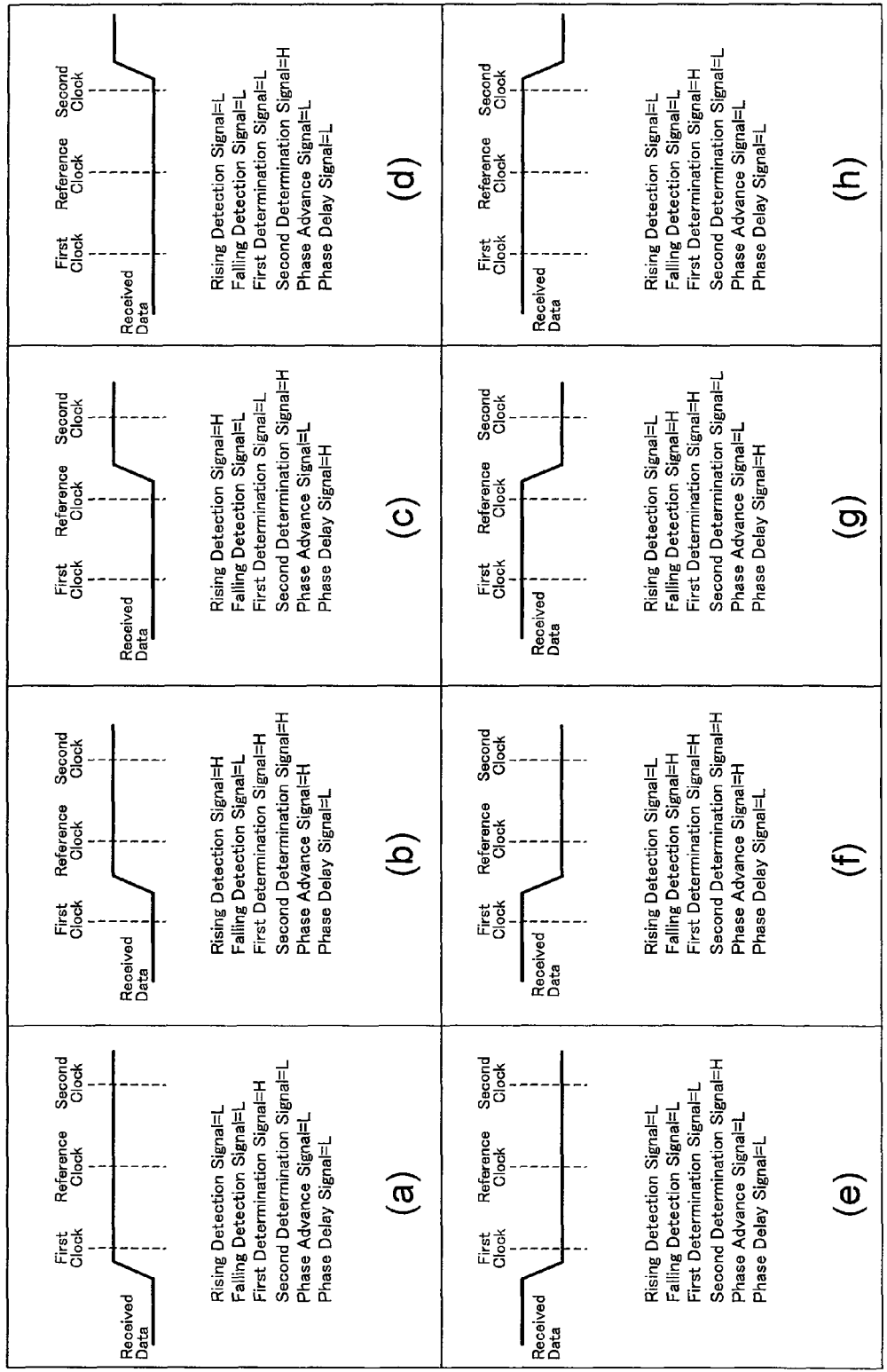
FIG. 6 is a diagram showing a list of a positional relationship between a first clock, a second clock, a reference clock, and a transition point of received data, outputs of the comparison period determiner 110, and outputs of the phase determiner 120, according to Embodiment 1.

FIG. 6 is a diagram showing a list of a positional relationship between the first clock, the second clock, the reference clock, and a transition point of received data, the outputs of the comparison period determiner 110, and the outputs of the phase determiner 120, in the configuration of this embodiment.

For example, as shown in (b) of FIG. 6, when a rising edge of received data is located before a rising edge of the reference clock, the comparison period determiner 110 outputs the rising detection signal which is at H and the falling detection signal which is at L during the comparison period. On the other hand, the phase determiner 120 outputs the first determination signal which is at H and the second determination signal which is at H. Here, as the rising detection signal is at H, the synchronous data generator 130 outputs as RD the first determination signal, i.e., a signal which is at H, in synchronization with the synchronization clock.

As described above, according to this embodiment, a single common system can be used to perform both the phase comparing process and the data receiving process, whereby the data receiving process on which the result of phase comparison is correctly reflected can be performed.

Variation of Embodiment 1

Figure 7:
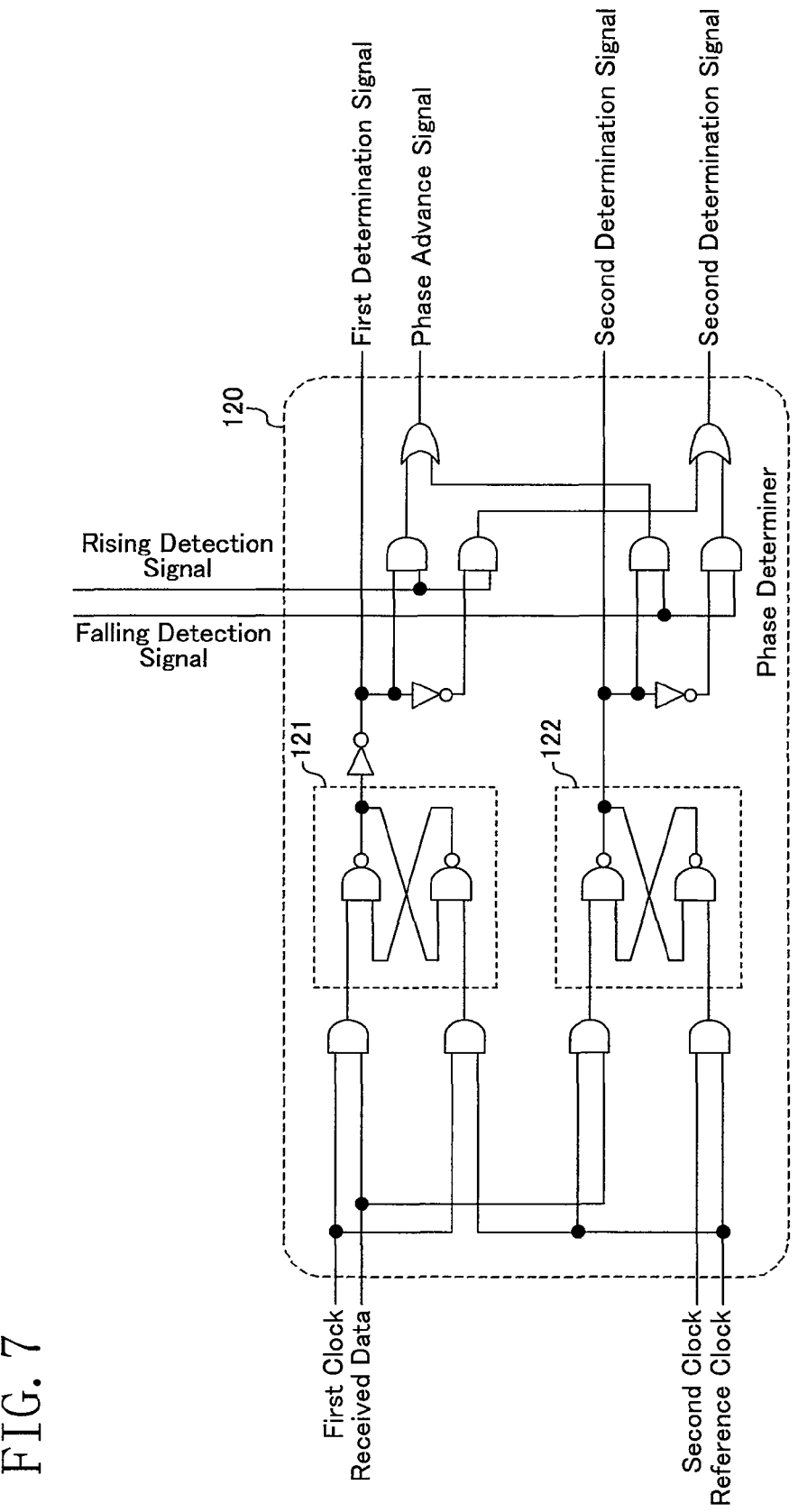
FIG. 7 is a diagram showing an example configuration of a phase determiner 120 according to a variation of Embodiment 1.

As another configuration of Embodiment 1, one which is shown in FIG. 7 can be used as the phase determiner 120. In this configuration, a falling edge of received data is not used.

Figure 8:
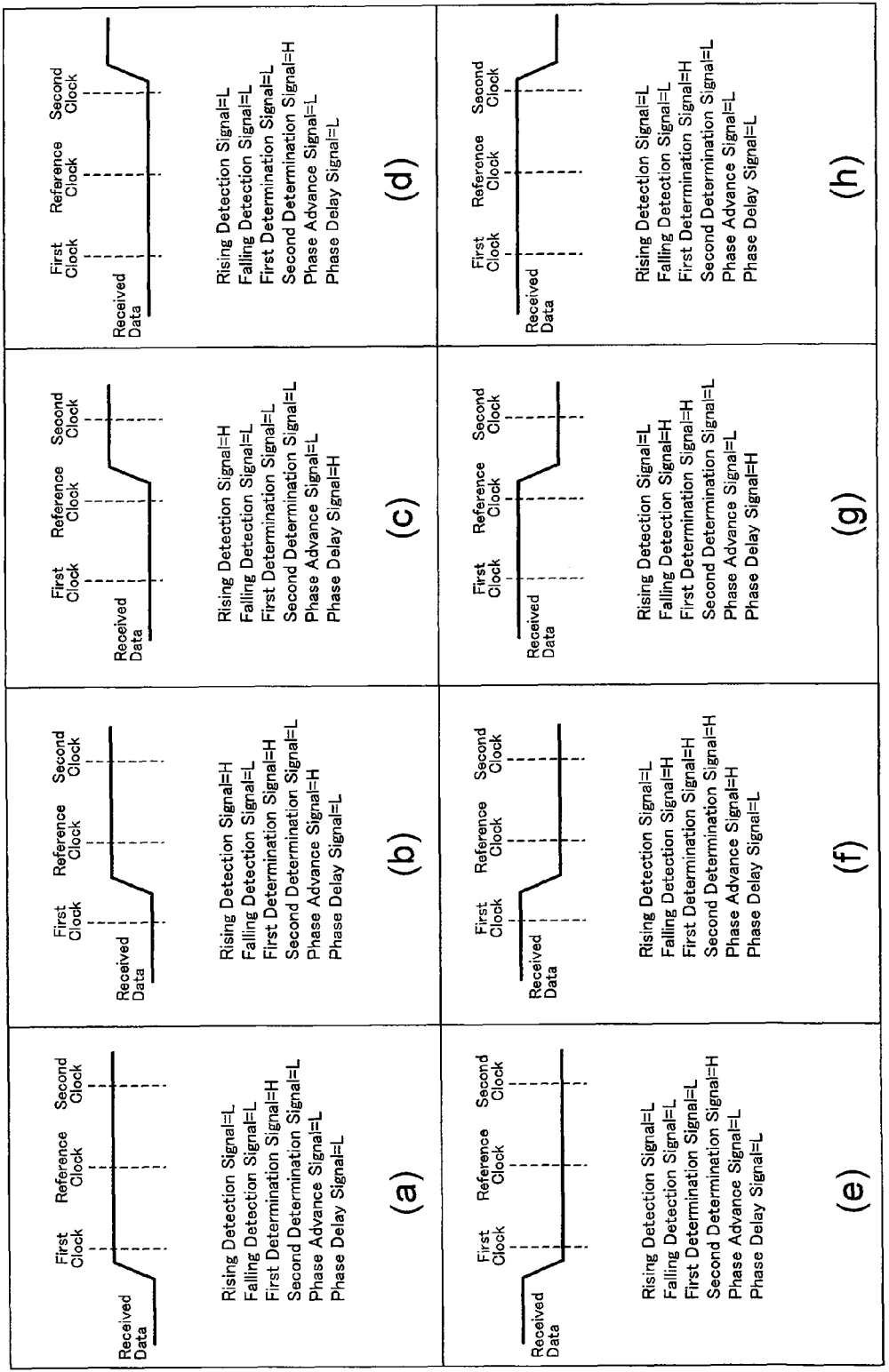
FIG. 8 is a diagram showing a list of a positional relationship between a first clock, a second clock, a reference clock, and a transition point of received data, outputs of a comparison period determiner 110, and outputs of the phase determiner 120, according to the variation of Embodiment 1.
Figure 9:
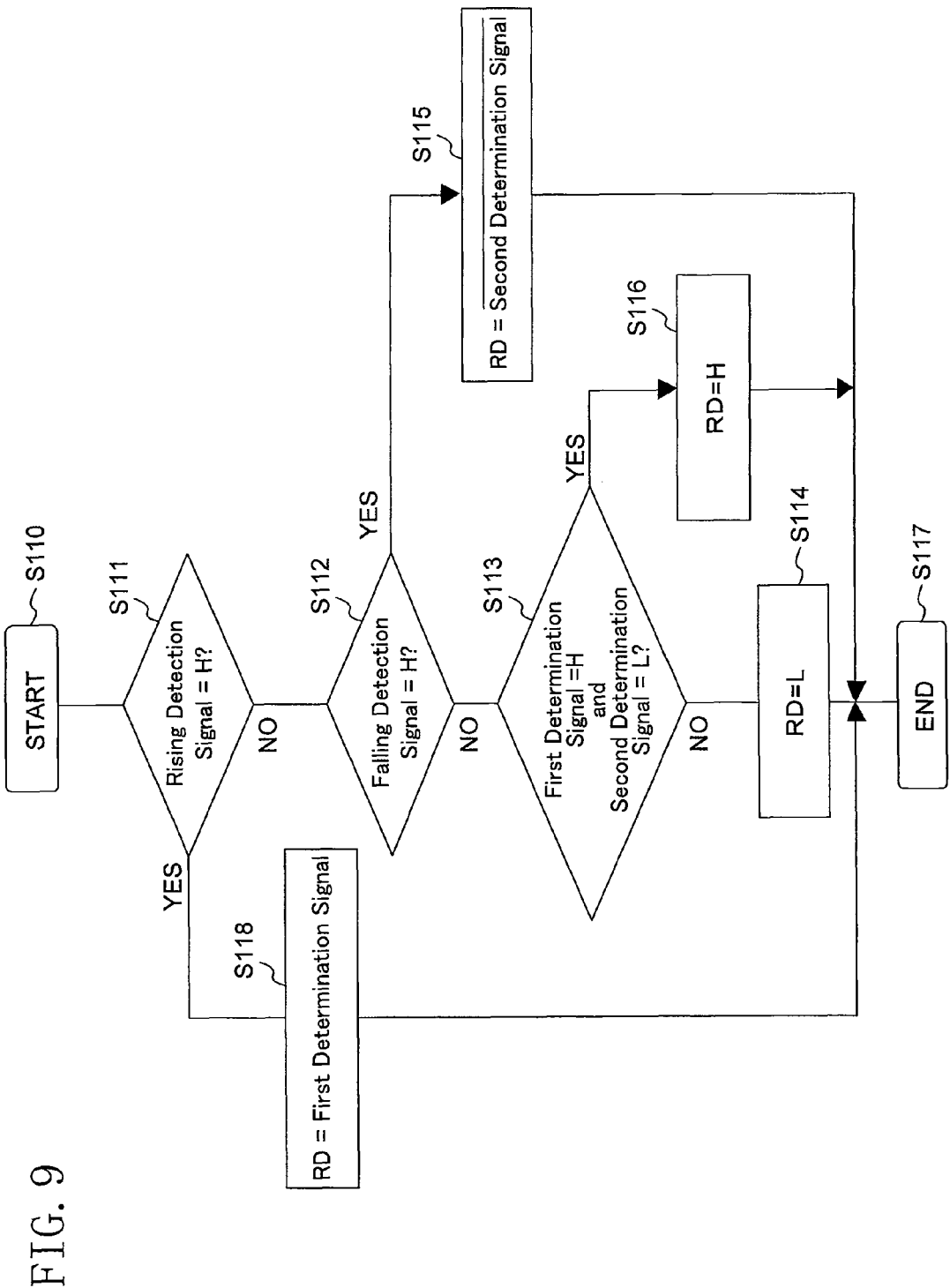
FIG. 9 is a flowchart for describing generation of RD by a logic circuit 131, according to the variation of Embodiment 1.

In this configuration, the outputs of the comparison period determiner 110 and the phase determiner 120 are as shown in FIG. 8, which vary depending on a phase relationship between the clocks and received data. Therefore, in this variation, the logic circuit 131 of the synchronous data generator 130 is configured to generate RD in accordance with a flowchart shown in FIG. 9.

After a process starts from step S110, the logic circuit 131 determines in step S111 whether or not the rising detection signal is at H. When the rising detection signal is at H, control proceeds to step S118, in which the logic circuit 131 outputs the first determination signal as RD. When the rising detection signal is at L, control proceeds to step S112.

In step S112, the logic circuit 131 determines whether or not the falling detection signal is at H. When the falling detection signal is at H, control proceeds to step S115, in which the logic circuit 131 outputs an inverted signal of the second determination signal as RD. When the falling detection signal is at L, control proceeds to step S113.

In step S113, the logic circuit 131 determines whether or not the first determination signal is at H and the second determination signal is at L. When the result of the determination is positive, the logic circuit 131 outputs a signal which is at H, as RD, in step S116; otherwise, the logic circuit 131 outputs a signal which is at L, as RD, in step S114.

The reason why the determination of step S113 is performed is that, under conditions of (d) and (e) of FIG. 8, when there is a skew in received data supplied to the comparison period determiner 110 and the phase determiner 120, the phase determiner 120 is likely to output a different result.

Under the condition of (d) of FIG. 8, the comparison period determiner 110 cannot detect a rising edge of received data, and therefore, the rising detection signal goes L. However, when the phase of received data in the phase determiner 120 is advanced as compared to the phase of the received data in the comparison period determiner 110, it is likely that a rising edge of the received data in the phase determiner 120 is located before a rising edge of the second clock, and therefore, the second determination signal goes L.

Also, under the condition of (e) of FIG. 8, the comparison period determiner 110 cannot detect a falling edge of received data, and therefore, the falling detection signal goes L. However, when the phase of received data in the phase determiner 120 is delayed as compared to the phase of the received data in the comparison period determiner 110, it is likely that, in the phase determiner 120, a falling edge is located after a rising edge of the first clock, and therefore, the first determination signal goes H. In order to deal with such a condition, determination for dealing with such a condition is performed in step S113 of FIG. 9 in this variation.

Embodiment 2 of the Invention

Figure 10:
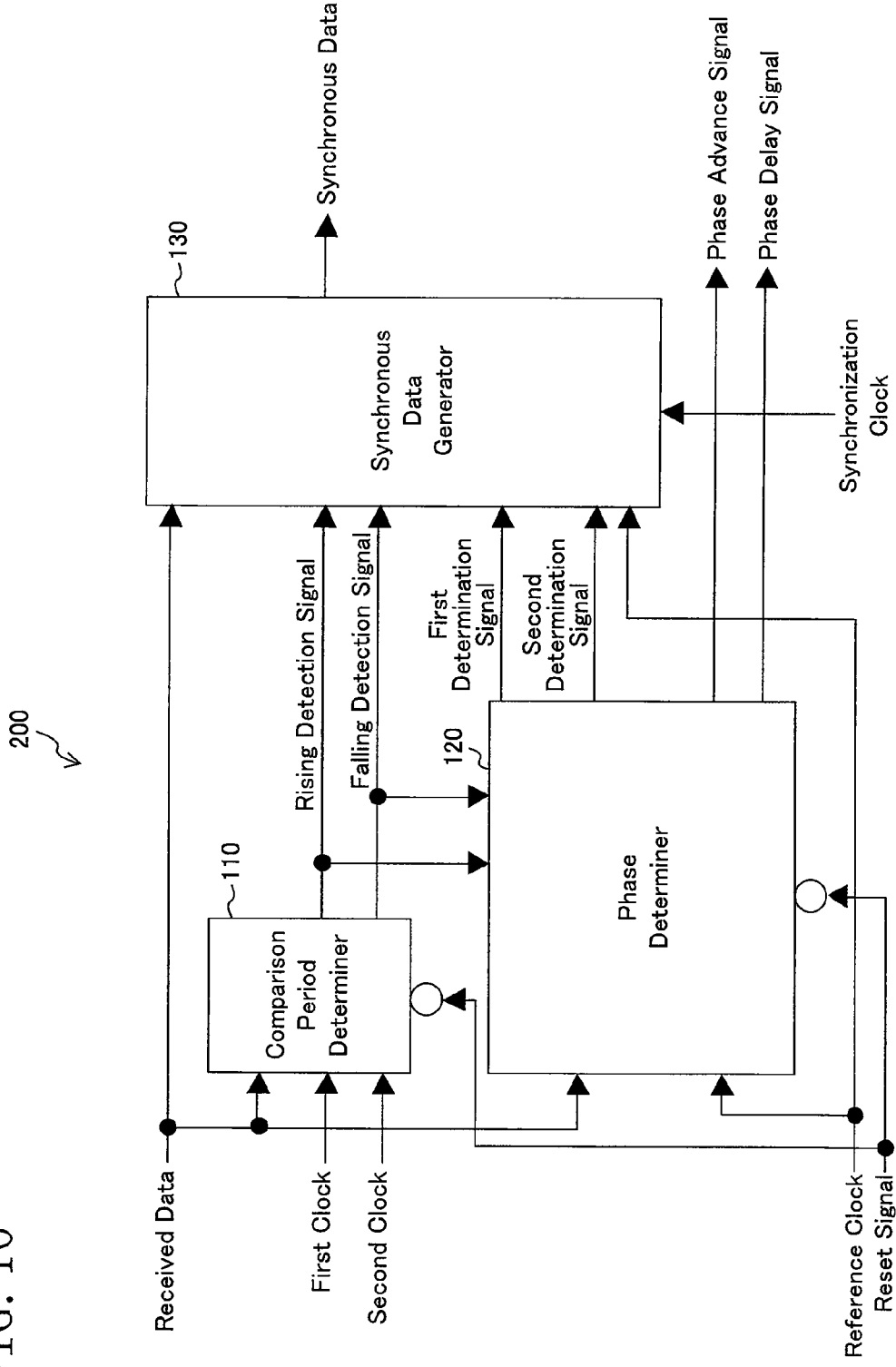
FIG. 10 is a block diagram showing a configuration of a timing recovery circuit 200 according to Embodiment 2.

FIG. 10 is a block diagram showing a configuration of a timing recovery circuit 200 according to Embodiment 2 of the present invention. The timing recovery circuit 200 is different from the timing recovery circuit 100 of Embodiment 1 in the configurations of the phase determiner 120 and the synchronous data generator 130.

Figure 11:
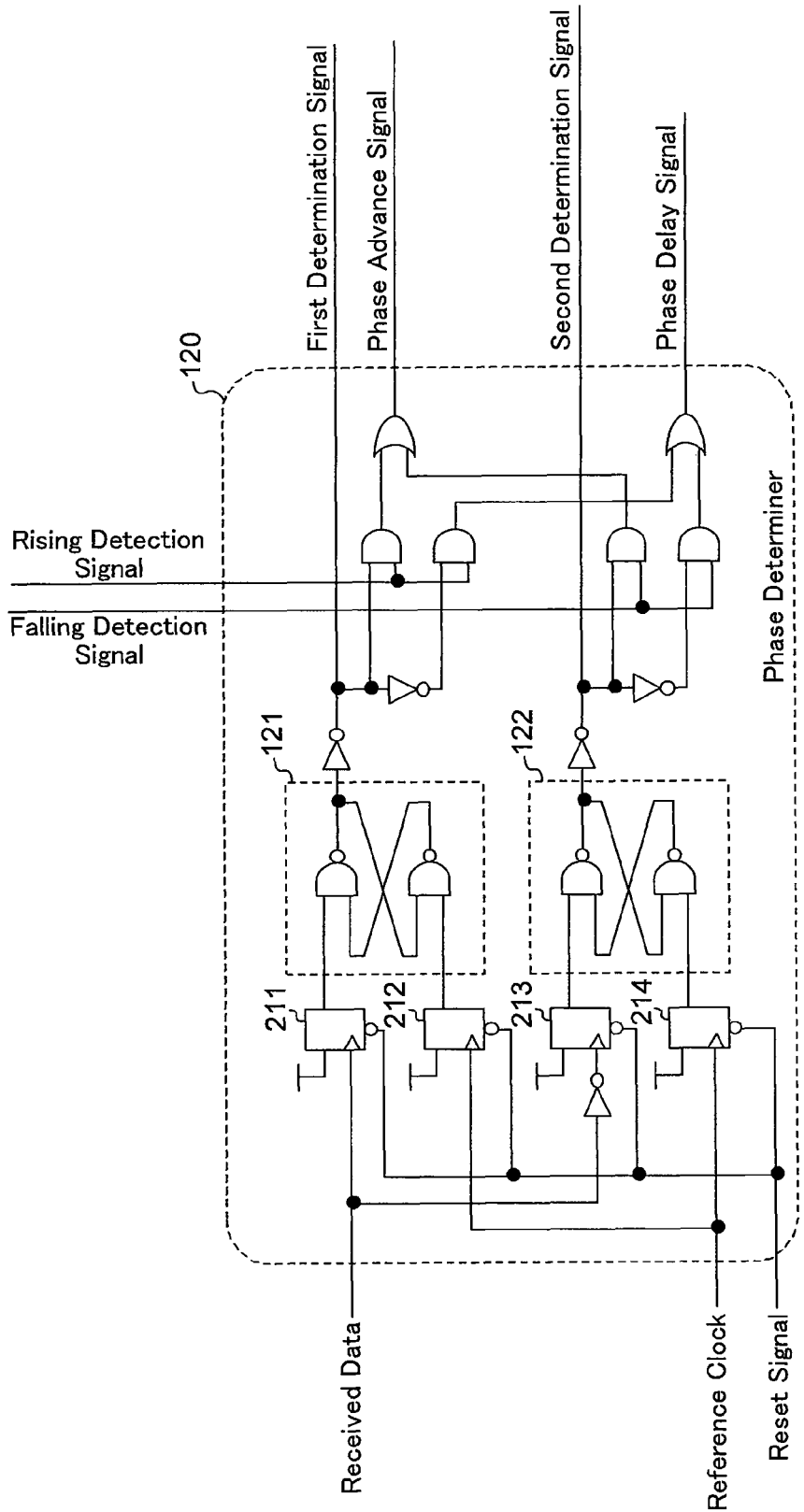
FIG. 11 is a diagram showing an example configuration of a phase determiner 120 according to Embodiment 2.

In this embodiment, the phase determiner 120 has a configuration, such as that shown in FIG. 11. The phase determiner 120 also receives received data and a reference clock, determines a phase relationship between the received data and the reference clock in this embodiment in a manner similar to that of Embodiment 1, and outputs a first determination signal, a second determination signal, a phase advance signal, and a phase delay signal.

The phase determiner 120 of FIG. 11 includes flip-flops 211 to 214. The flip-flops 211 to 214 have a reset function. The phase determiner 120 of Embodiment 2 is different from the phase determiner 120 of Embodiment 1 (see FIG. 3) in that it is a flip-flop or a logical AND circuit that is used to mask the received data and the reference clock using a reset signal.

In the configuration of FIG. 11, the output of each flip-flop is fixed to L unless a rising edge is input to the clock input of the flip-flop. Therefore, none of the outputs of the RS latches 121 and 122 change. For example, assuming that received data is fixed to H, whereas the first determination signal goes H when the reset signal goes from L to H in the configuration of FIG. 3, the first determination signal is maintained at L as there is not a rising edge in the received data in this embodiment.

Figure 12:
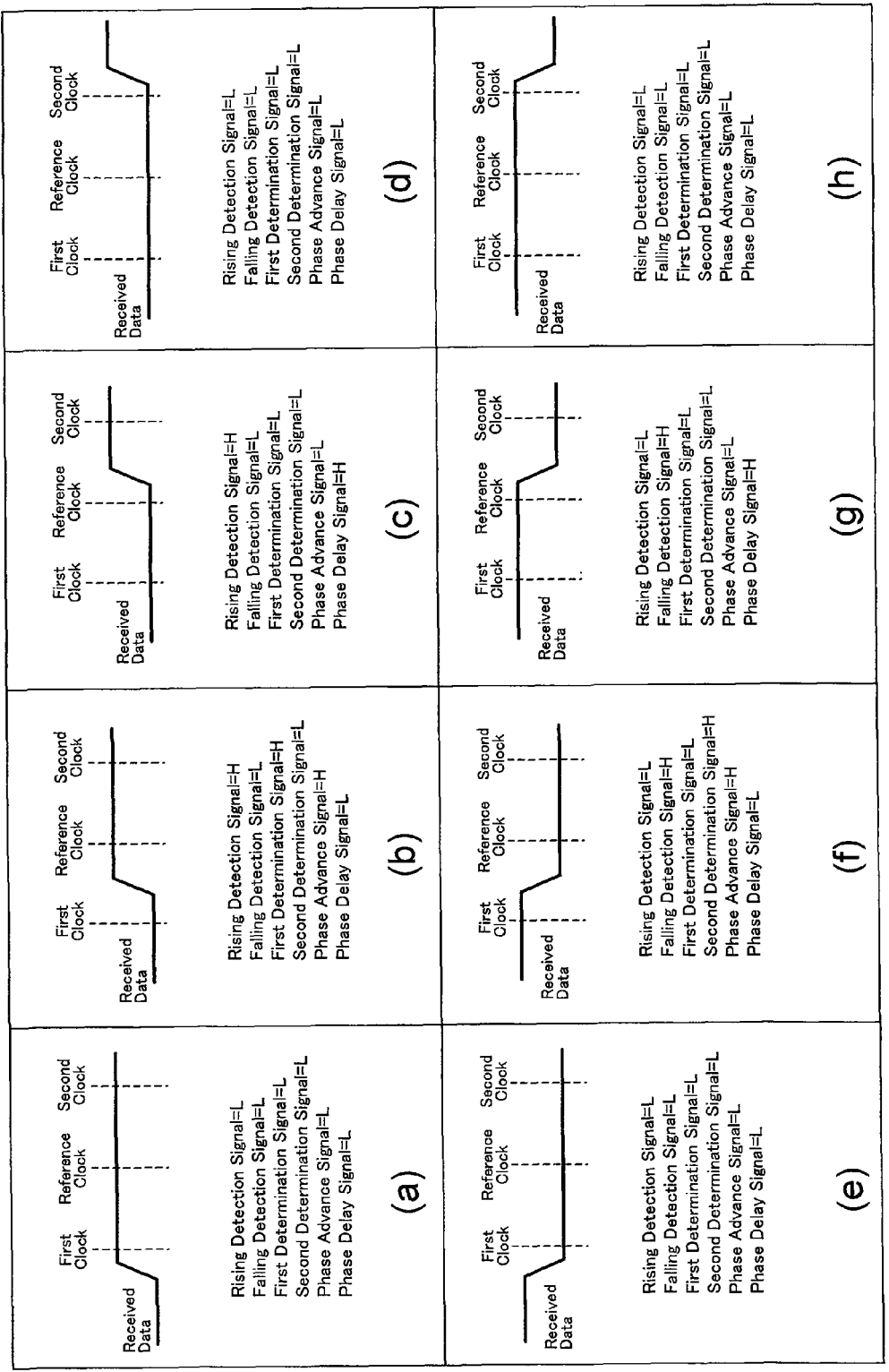
FIG. 12 is a diagram showing a list of a positional relationship between a first clock, a second clock, a reference clock, and a transition point of received data, outputs of a comparison period determiner 110, and outputs of the phase determiner 120, according to Embodiment 2.

Although this embodiment is different from Embodiment 1 in the aforementioned configuration, also in this embodiment the RS latch 121 determines a phase relationship between received data and a reference clock, and the RS latch 122 determines a phase relationship between an inverted signal of the received data and the reference clock. As a result, signals output from the comparison period determiner 110 and the phase determiner 120 are as shown in FIG. 12, which vary depending on the phase relationship between the clock and the received data. The synchronous data generator 130 generates synchronous data, depending on these outputs.

Figure 13:
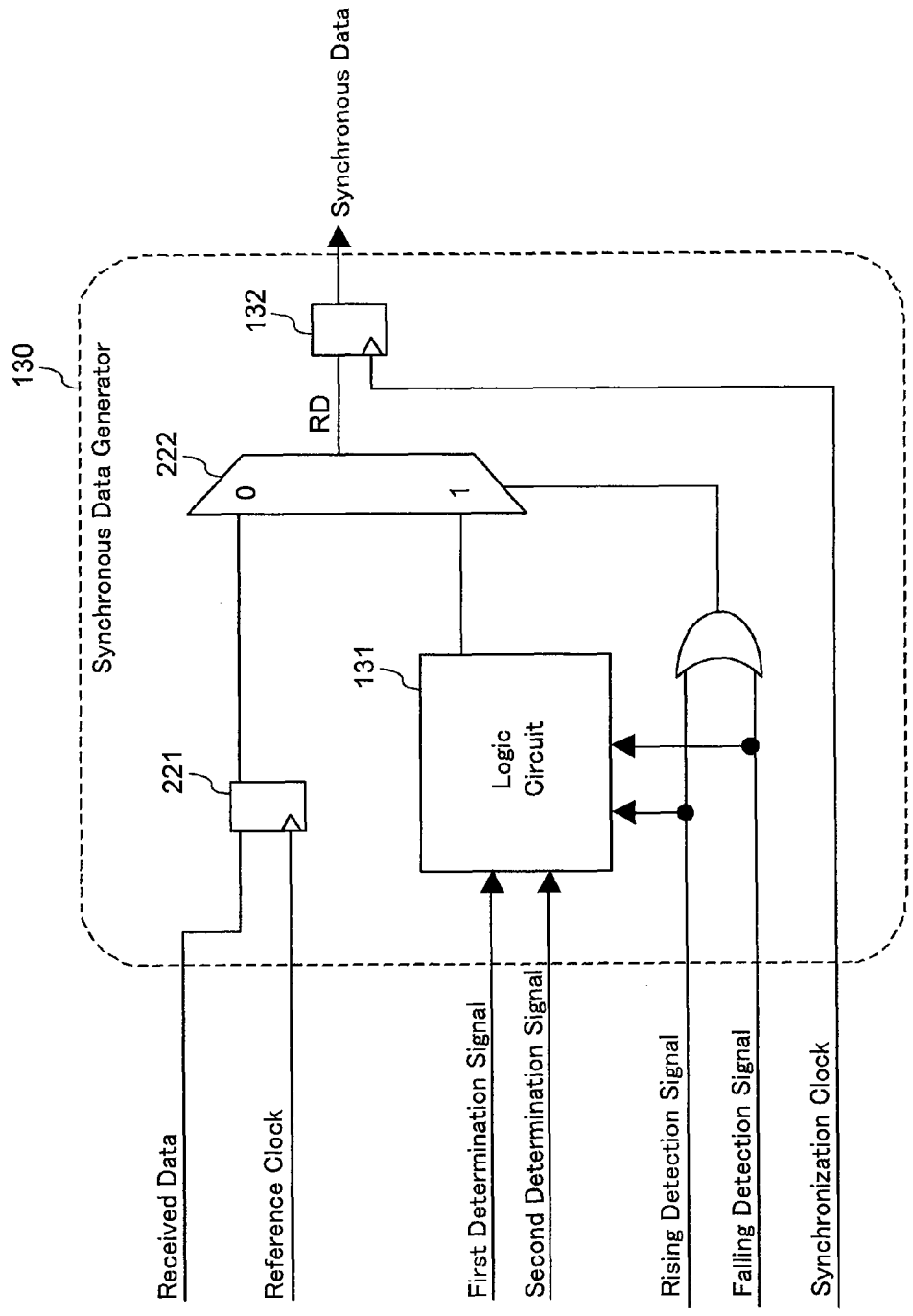
FIG. 13 is a diagram showing an example configuration of a synchronous data generator 130 according to Embodiment 2.

FIG. 13 is a diagram showing a configuration of the synchronous data generator 130 of this embodiment. The synchronous data generator 130 also receives the rising detection signal, the falling detection signal, the first determination signal, and the second determination signal, generates synchronous data, depending on these signals, and outputs the synchronous data in synchronization with a synchronization clock. Note that, also in this embodiment, it is assumed that the outputs of the comparison period determiner 110 and the phase determiner 120 are reset at the time when the synchronous data is output.

As shown in FIG. 13, the synchronous data generator 130 includes a flip-flop 221, a selector 222, a flip-flop 132, and a logic circuit 131.

The flip-flop 221 captures received data in synchronization with the reference clock.

Figure 14:
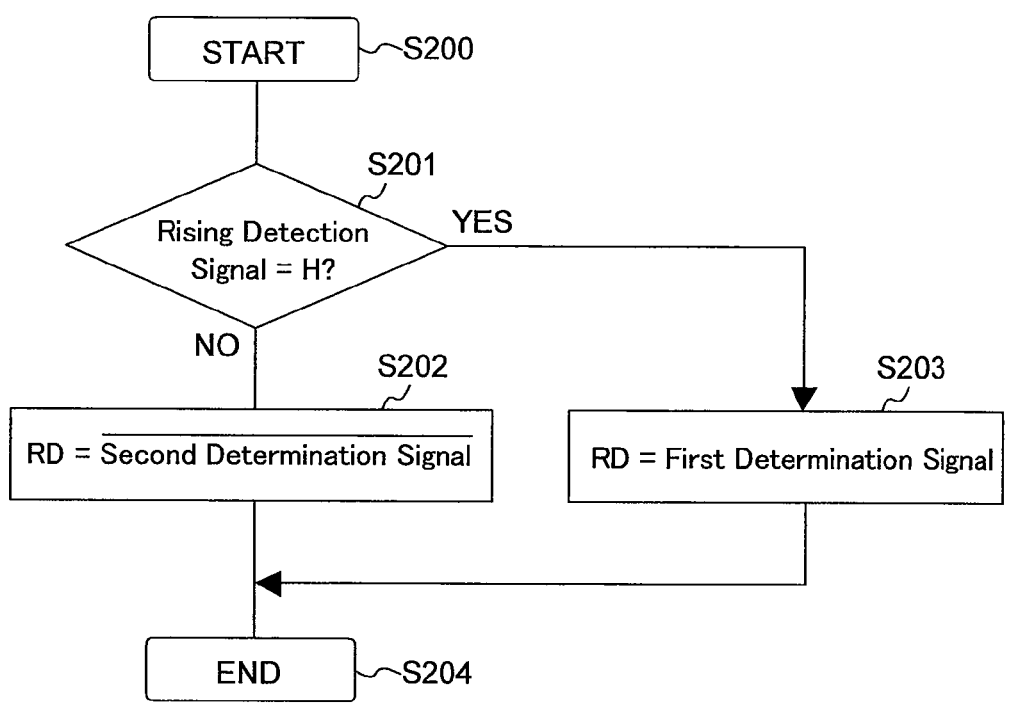
FIG. 14 is a flowchart for describing generation of RD by a logic circuit 131 according to Embodiment 2.

Also in this embodiment, the logic circuit 131 determines an output, depending on the first determination signal, the second determination signal, the rising detection signal, and the falling detection signal. Specifically, the logic circuit 131 determines an output in accordance with a flowchart shown in FIG. 14.

After a process starts from step S200, the logic circuit 131 determines in step S201 whether or not the rising detection signal is at H. When the result of the determination is positive, control proceeds to step S203, in which the logic circuit 131 outputs the first determination signal. When the rising detection signal is at L in step S201, control proceeds to step S202, in which the logic circuit 131 outputs an inverted signal of the second determination signal.

The selector 222, when any one of the rising detection signal and the falling detection signal is at H, selects the output of the logic circuit 131; otherwise, the selector 222 selects the output of the flip-flop 221, and outputs the selected result as RD.

According to the aforementioned configuration, when there is a transition point of received data during the comparison period, the output of the logic circuit 131 is used as RD. Also, when there is not a transition point of received data during the comparison period, i.e., when there is a timing margin which allows the flip-flop 221 to capture the received data, the output of the flip-flop 221 is used as RD.

Embodiment 3 of the Invention

Figure 15:
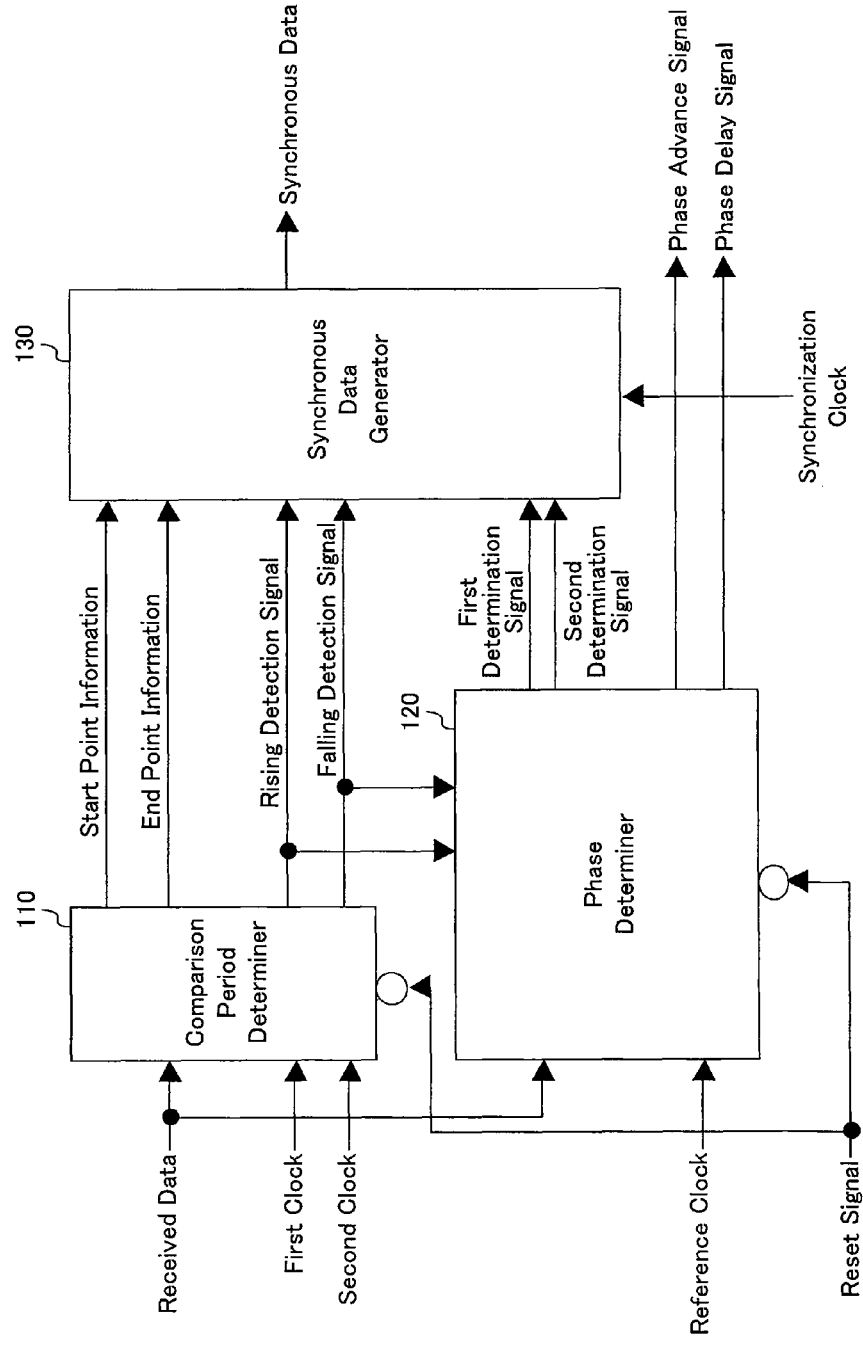
FIG. 15 is a block diagram showing a configuration of a timing recovery circuit 300 according to Embodiment 3.

FIG. 15 is a block diagram showing a configuration of a timing recovery circuit 300 according to Embodiment 3 of the present invention. The timing recovery circuit 300 is different from those of Embodiments 1 and 2 and the like in the configurations of the comparison period determiner 110 and the synchronous data generator 130.

The comparison period determiner 110 of this embodiment outputs the rising detection signal and the falling detection signal as in Embodiments 1 and 2, and in addition, outputs received data at the time of occurrence of a rising edge of the first clock and received data at the time of occurrence of a rising edge of the second clock as start point information and an end point information.

Figure 16:
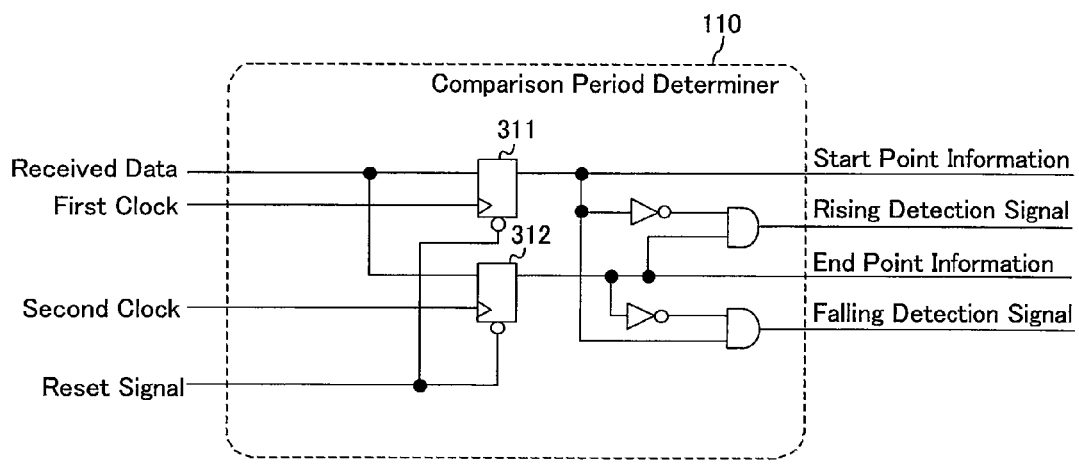
FIG. 16 is a diagram showing an example configuration of a comparison period determiner 110 according to Embodiment 3.

In this embodiment, the comparison period determiner 110 has a configuration, such as that shown in FIG. 16. In FIG. 16, a flip-flop 311 and a flip-flop 312 have a reset function. The flip-flops 311 and 312 capture received data in synchronization with the first and second clocks, respectively. The comparison period determiner 110 outputs the output of the flip-flop 311 as the start point information, and the output of the flip-flop 312 as the end point information. The comparison period determiner 110 also outputs the logical AND of an inverted signal of the start point information and the end point information as the rising detection signal, and the logical AND of an inverted signal of the end point information and the start point information as the falling detection signal.

Figure 17:
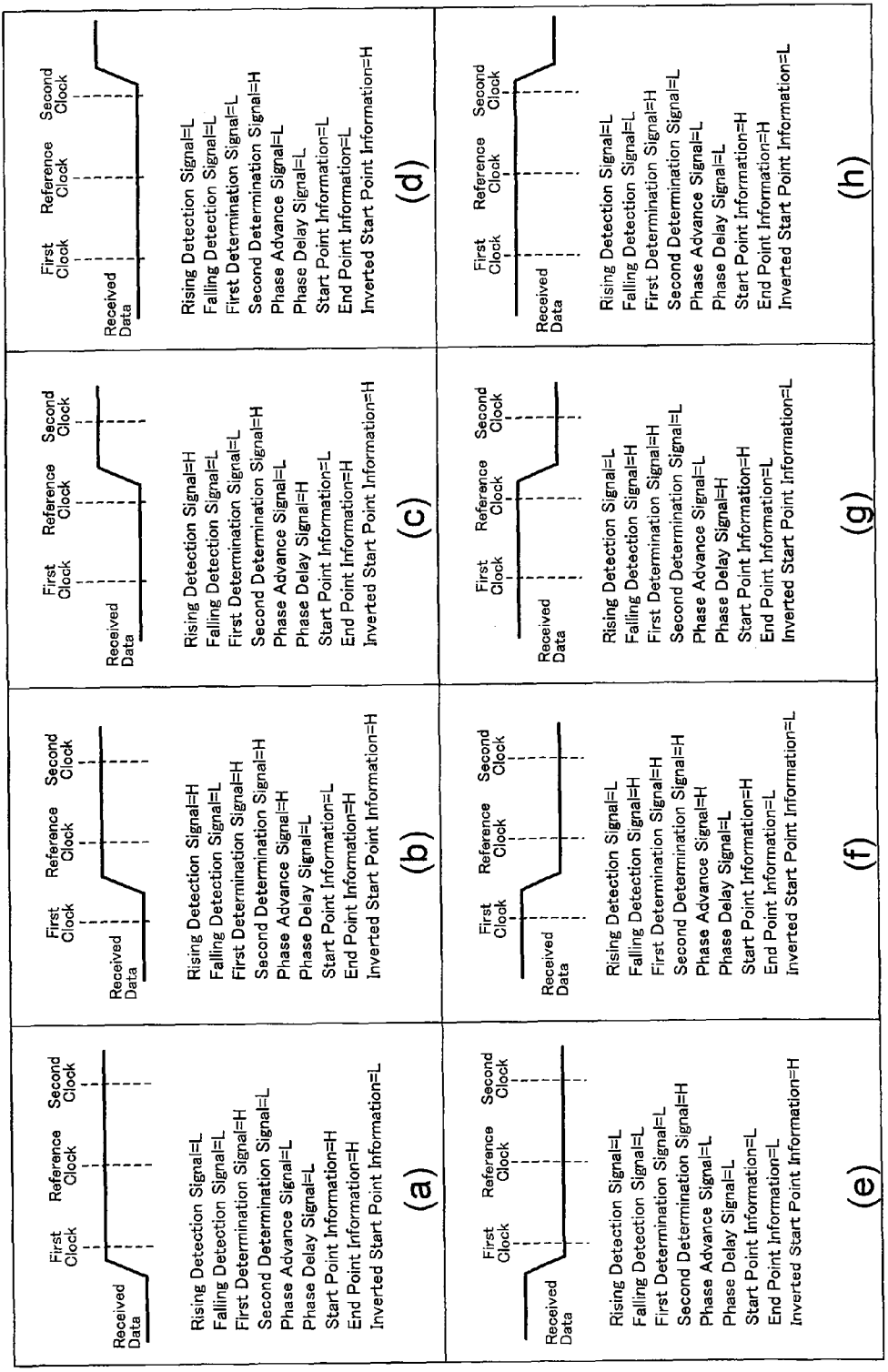
FIG. 17 is a diagram showing a list of a positional relationship between a first clock, a second clock, a reference clock, and a transition point of received data, outputs of the comparison period determiner 110, and outputs of a phase determiner 120, according to Embodiment 3.

With such a combination of the comparison period determiner 110 and the phase determiner 120, the outputs are as shown in FIG. 17, which vary depending on a phase relationship between the clocks and the received data. The synchronous data generator 130 generates and outputs synchronous data, depending on the outputs.

The synchronous data generator 130 of this embodiment receives the rising detection signal, the falling detection signal, the first determination signal, the second determination signal, the start point information, and the end point information, generates synchronous data, depending on these signals, and outputs the synchronous data in synchronization with a synchronization clock. Note that, also in this embodiment, it is assumed that the outputs of the comparison period determiner 110 and the phase determiner 120 are reset at the time when the synchronous data is output.

Figure 18:
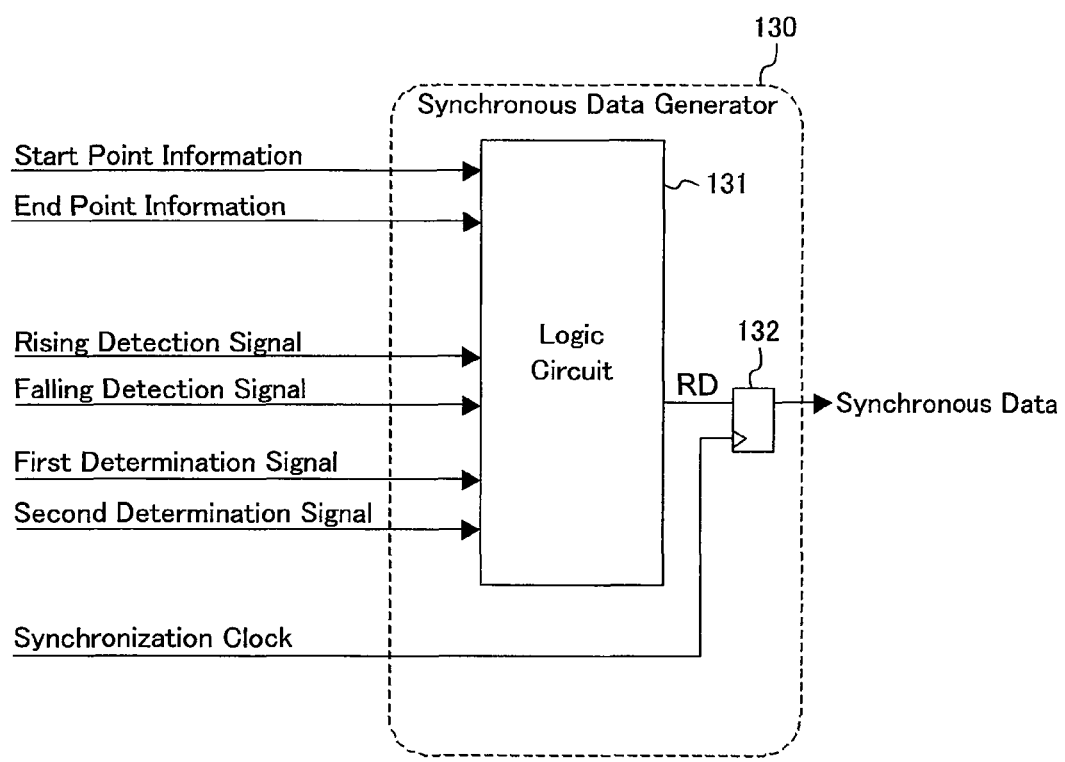
FIG. 18 is a diagram showing an example configuration of a synchronous data generator 130 according to Embodiment 3.

FIG. 18 is a diagram showing a configuration of the synchronous data generator 130 of this embodiment. As shown in FIG. 18, the synchronous data generator 130 includes a logic circuit 131 and a flip-flop 132.

Figure 19:
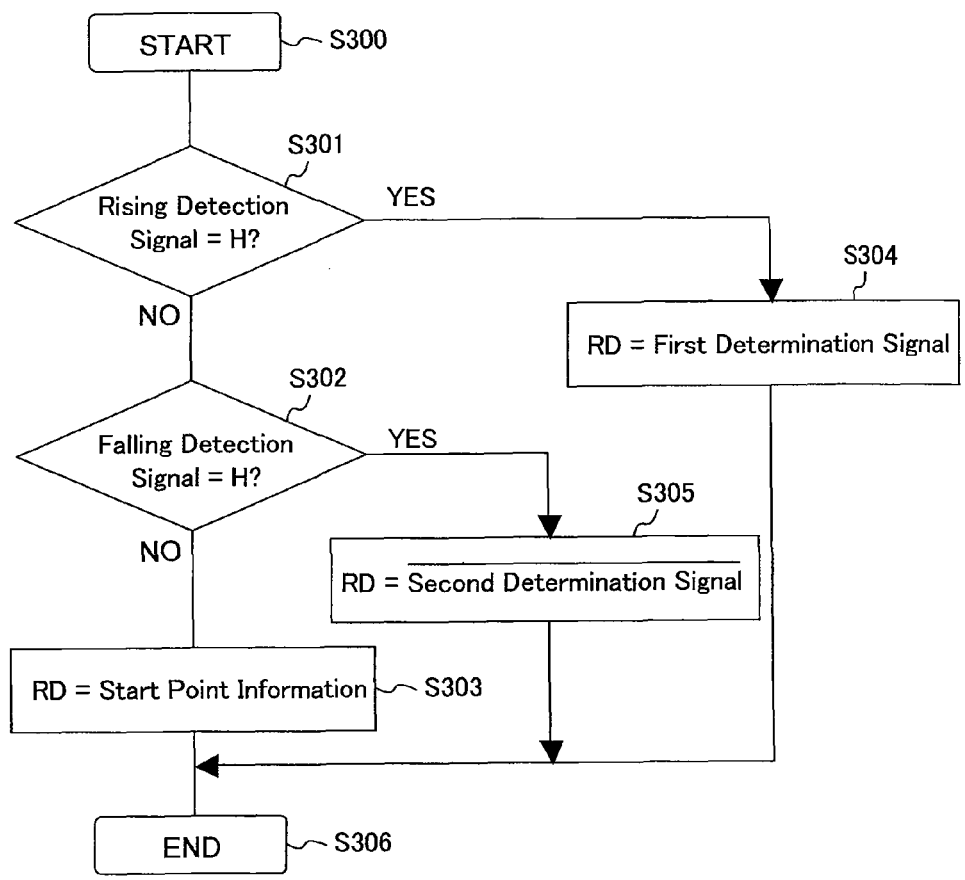
FIG. 19 is a flowchart for describing generation of RD by a logic circuit 131 according to Embodiment 3.

Also in this embodiment, the logic circuit 131 generates RD, depending on the inputs. The logic circuit 131 of this embodiment generates RD in accordance with a flowchart shown in FIG. 19. The logic circuit 131 starts a process from step S300. In step S301, when the rising detection signal is at H, control proceeds to step S304, in which the logic circuit 131 outputs the first determination signal as RD, and when the rising detection signal is at L, control proceeds to step S302, in which the logic circuit 131 determines whether or not the falling detection signal is at H. When the falling detection signal is at H, the logic circuit 131 outputs an inverted signal of the second determination signal as RD in step S305, and when the falling detection signal is at L, the logic circuit 131 outputs the start point information as RD in step S303.

The RD thus determined is caused to be synchronous with the synchronization clock by the flip-flop 132, and is output as synchronous data.

Note that the logic circuit 131 can generate RD using the end point information instead of the start point information. Also when the end point information is used, the held value is used as synchronous data when there is not transition in data during the comparison period.

Variation of Embodiment 3

Figure 20:
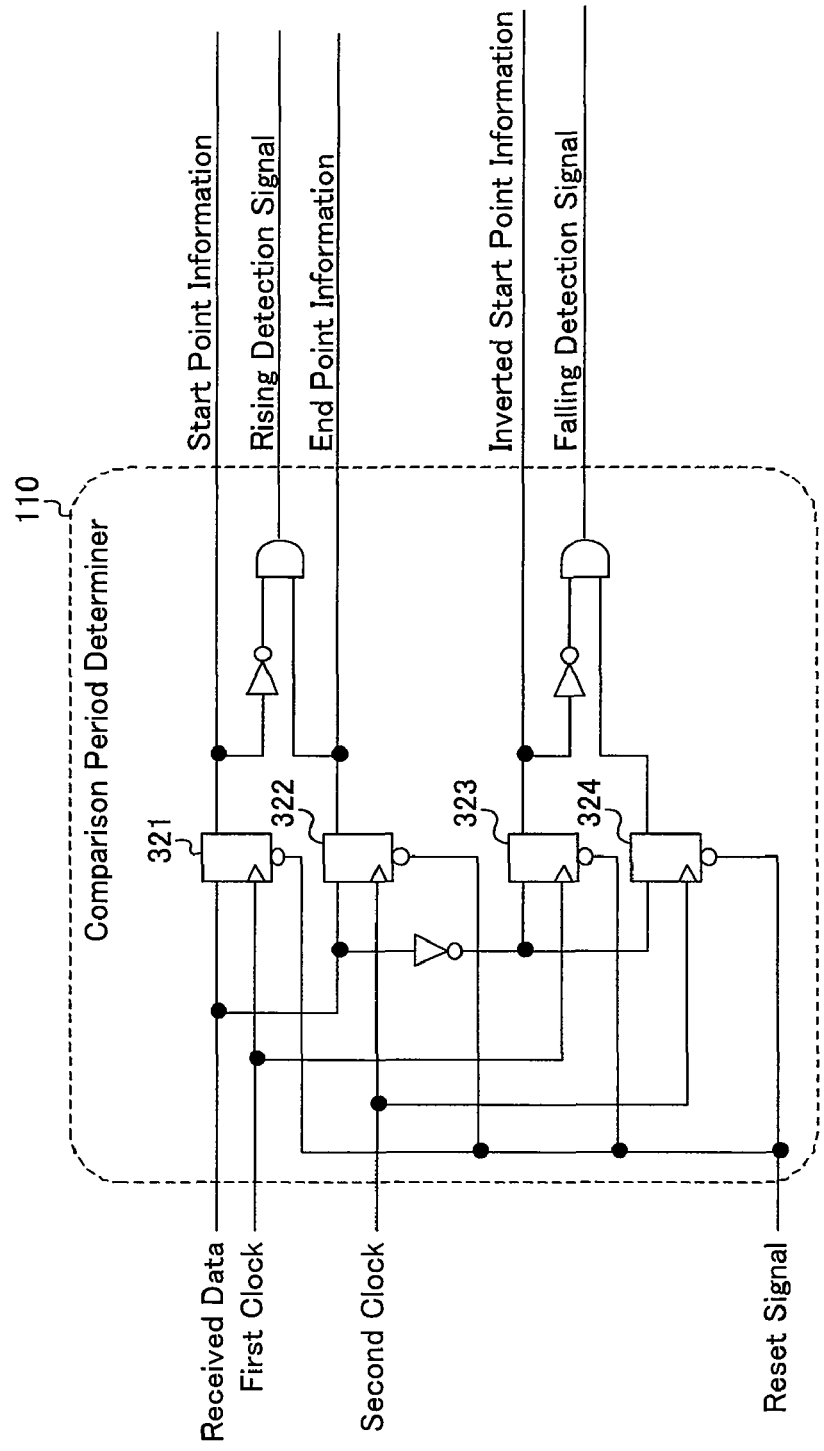
FIG. 20 is a diagram showing an example configuration of a comparison period determiner 110 according to a variation of Embodiment 3.

The comparison period determiner 110 can have a configuration shown in FIG. 20. In this case, inverted start point information which is start point information for an inverted signal of received data is used to generate synchronous data.

Figure 21:
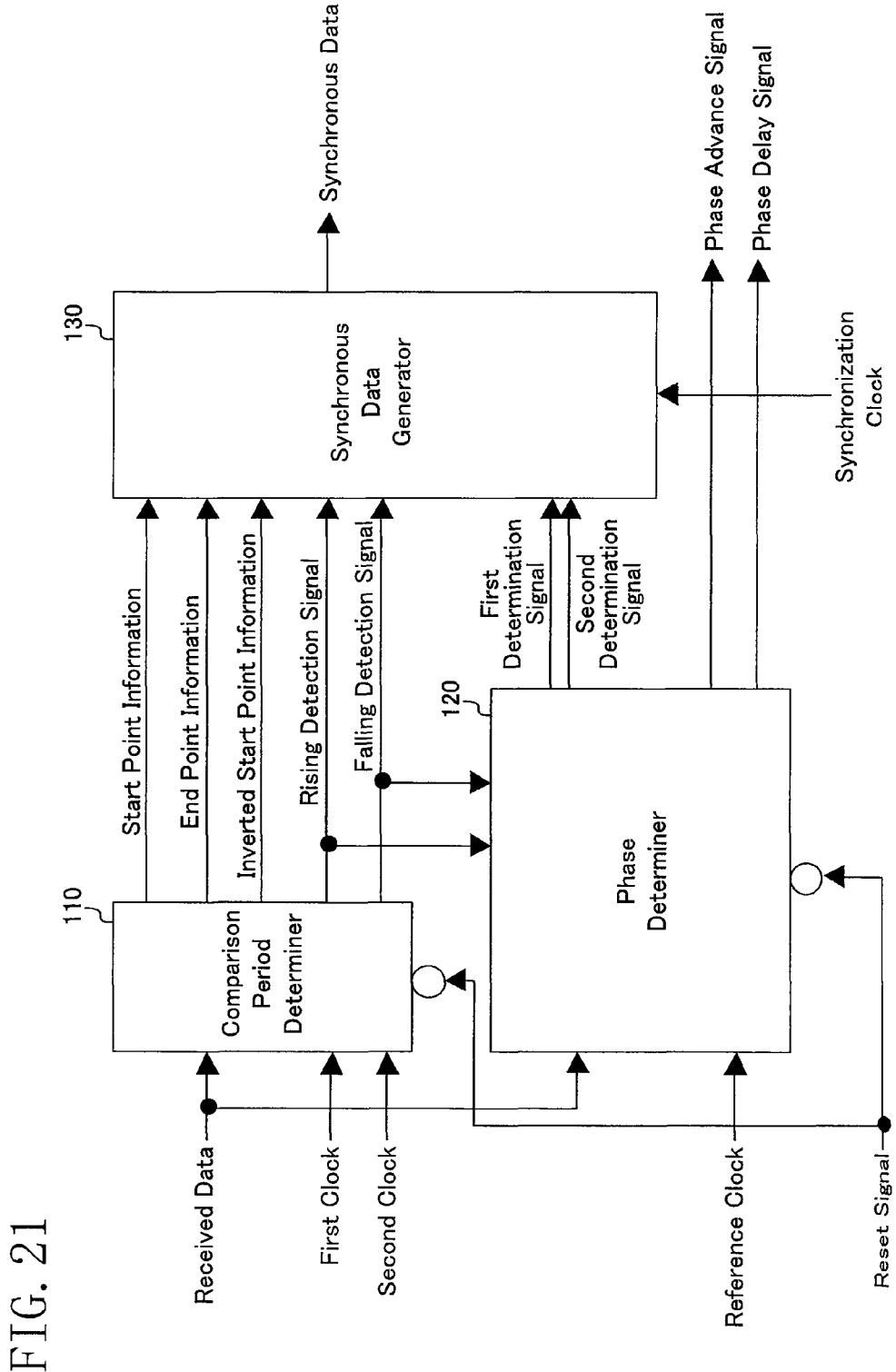
FIG. 21 is a block diagram showing a configuration of a timing recovery circuit according to the variation of Embodiment 3.

FIG. 21 is a block diagram showing a configuration of a timing recovery circuit which includes the comparison period determiner 110 of FIG. 20. This timing recovery circuit is different from those of Embodiment 3 and the like in the configurations of the comparison period determiner 110 and the synchronous data generator 130.

In FIG. 20, flip-flops 321 to 324 have a reset function.

The flip-flops 321 and 322 capture received data in synchronization with a first clock and a second clock, respectively. The comparison period determiner 110 outputs the output of the flip-flop 321 as start point information, and the output of the flip-flop 322 as end point information. In this case, the comparison period determiner 110 outputs the logical AND of an inverted signal of the start point information and the end point information as a rising detection signal.

On the other hand, the flip-flops 323 and 324 capture an inverted signal of the received data in synchronization with the first and second clocks, respectively. The output of the flip-flop 323 is output as inverted start point information. Also, in this case, the comparison period determiner 110 outputs the logical AND of an inverted signal of the inverted start point information and the output of the flip-flop 324 as a falling detection signal. The outputs of the comparison period determiner 110 and the phase determiner 120 are as shown in FIG. 17, which vary depending on a phase relationship between the clocks and the received data.

The synchronous data generator 130 in this embodiment receives the start point information, the end point information, the inverted start point information, the rising detection signal, the falling detection signal, the first determination signal, and the second determination signal, and generates synchronous data depending on these signals.

Figure 22:
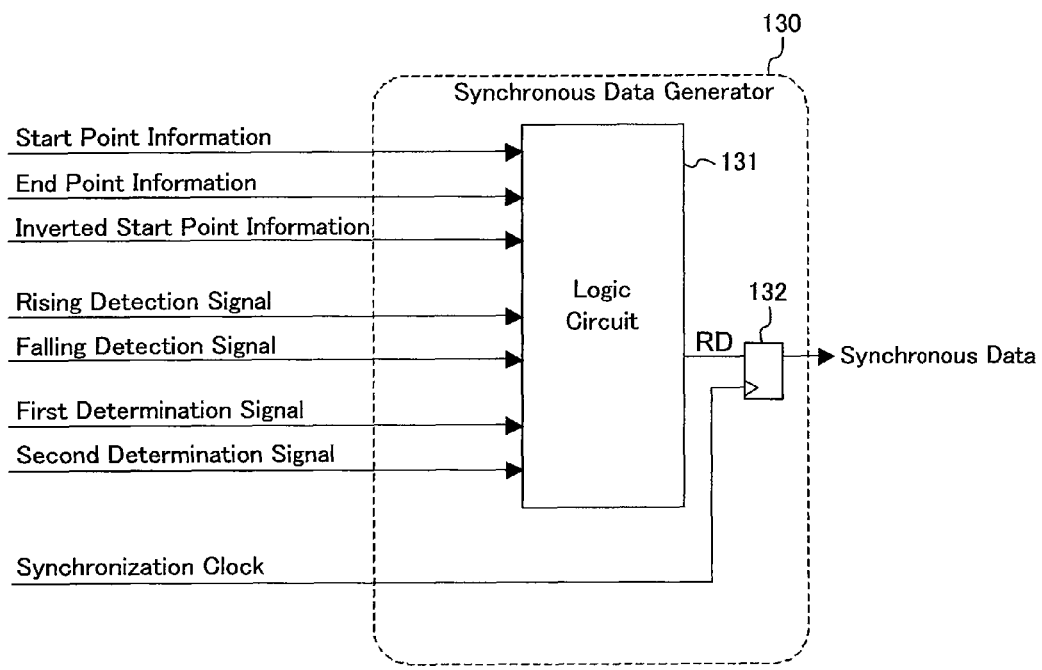
FIG. 22 is a diagram showing an example configuration of a synchronous data generator 130 according to the variation of Embodiment 3.

FIG. 22 is a diagram showing a configuration of the synchronous data generator 130 of this embodiment. As shown in FIG. 22, the synchronous data generator 130 includes the logic circuit 131 and the flip-flop 132.

Also in this embodiment, the logic circuit 131 generates RD depending on the inputs.

Figure 23:
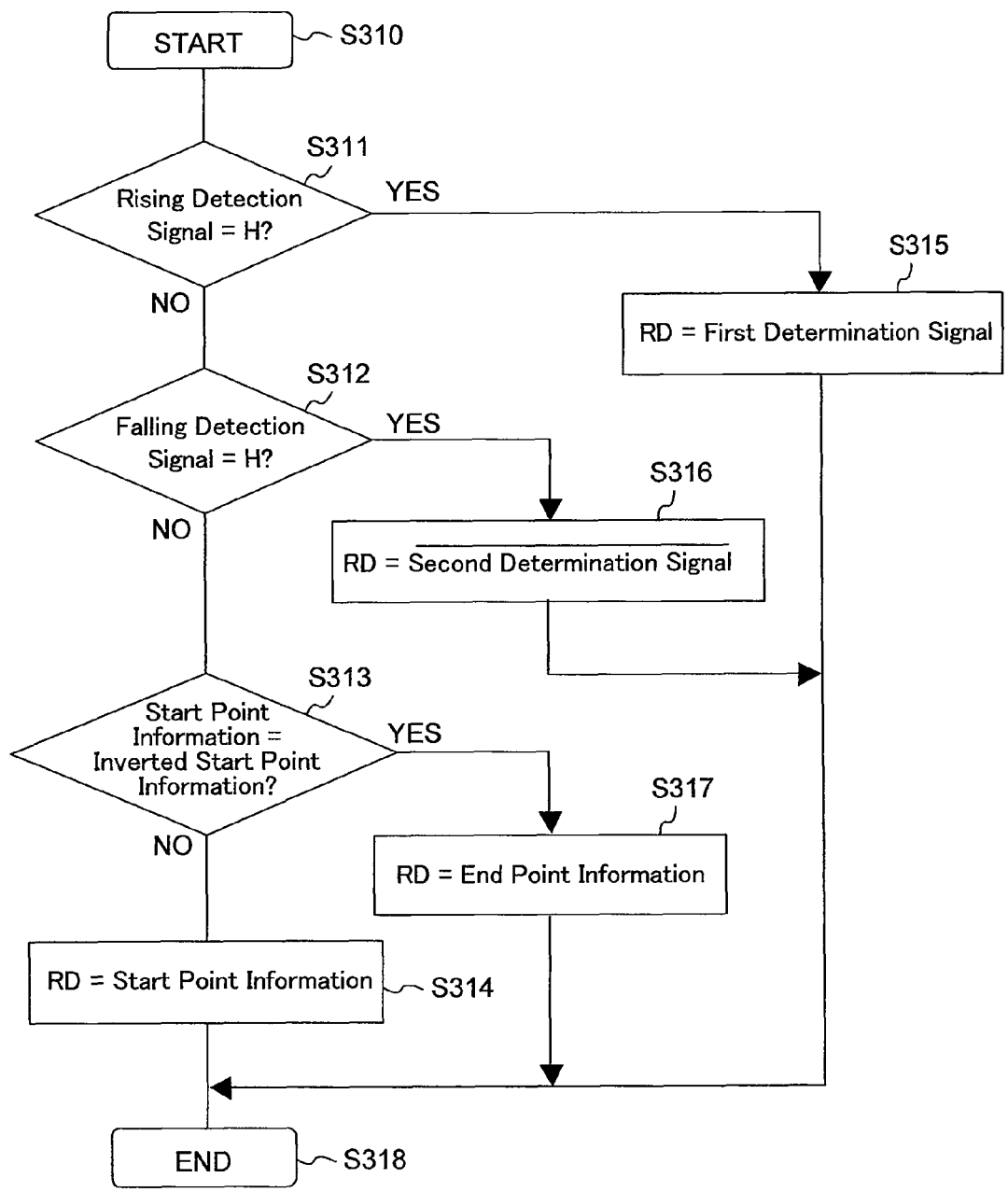
FIG. 23 is a flowchart for describing generation of RD by a logic circuit 131 according to the variation of Embodiment 3.

The logic circuit 131 of this embodiment generates RD in accordance with a flowchart shown in FIG. 23. The logic circuit 131 starts a process from step S310, and determines whether or not the rising detection signal is at H in step S311. As a result, when the rising detection signal is at H, control proceeds to step S315, in which the logic circuit 131 outputs the first determination signal as RD. When the rising detection signal is not at H, control proceeds to step S312, in which the logic circuit 131 determines whether or not the falling detection signal is at H. When the falling detection signal is at H, control proceeds to step S316, in which the logic circuit 131 outputs an inverted signal of the second determination signal as RD. When the falling detection signal is not at H, control proceeds to step S313.

In step S313, the logic circuit 131 determines whether or not the start point information is the same as the inverted start point information. As a result, when both of them are the same, control proceeds to step S317, in which the logic circuit 131 outputs the end point information as RD, and when both of them are not the same, control proceeds to step S314, in which the logic circuit 131 outputs the start point information as RD.

The reason why the start point information is compared with the inverted start point information in step S313 is that there is a possibility that the outputs of the flip-flops 321, 322, 323 and 324 do not necessarily have a correct value, depending on a phase relationship between the first clock, the second clock and received data. The start point information and the inverted start point information normally have an inversion relationship. However, for example, if there is a skew between received data and an inverted signal of the received data, or if the outputs of the flip-flops 321, 322, 323 and 324 are in the metastable state, the inversion relationship is not established. Therefore, when the start point information is the same as the inverted start point information, the reliability of the start point information is considered to be low, and therefore, the end point information is used as RD instead of the start point information. Likewise, there is a possibility that such a phenomenon occurs in the end point information. Therefore, a signal having the higher reliability is selected as RD.

The RD determined by the aforementioned process is caused to be synchronous with a synchronization clock by the flip-flop 132, and is output as synchronous data.

Embodiment 4 of the Invention

Figure 24:
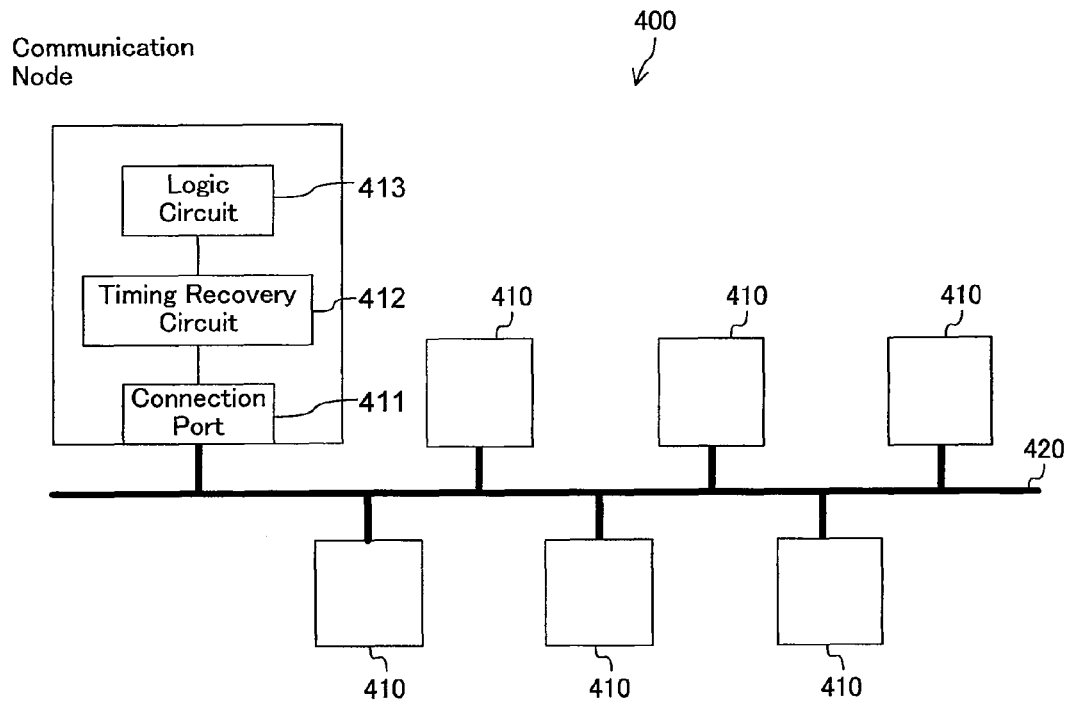
FIG. 24 is a block diagram showing a network system 400 according to Embodiment 4.

In Embodiment 4, a case where the timing recovery circuit of the present invention is applied to a communication node, will be described. FIG. 24 shows a network system 400 including such a communication node. As shown in FIG. 24, the network system 400 includes communication nodes 410 and a network cable 420.

The communication nodes 410 each include a connection port 411, a timing recovery circuit 412 (any of those of the aforementioned embodiments and variations), and a logic circuit 413.

Each communication node 410 connected to the network cable 420 has its own clock source. Therefore, data communication between the communication nodes 410 is asynchronous communication. Data transmitted via the network cable 420 is received by the connection port 411 and is converted into received data having an appropriate amplitude. The received data is transferred to the timing recovery circuit 412, in which phase adjustment is performed based on phase comparison between an internal clock of the communication node 410 and the received data, and at the same time, a synchronous data generation process described in each embodiment is performed. The generated synchronous data is input to the logic circuit 413, and the communication process is completed.

Embodiment 5 of the Invention

The applications of the timing recovery circuit of the present invention are not limited to network systems, such as that described above. For example, FIG. 25 is a diagram showing an example application in which the timing recovery circuit of the present invention is applied to a read channel (electronic device 500) for reading information from a storage medium.

Figure 25:
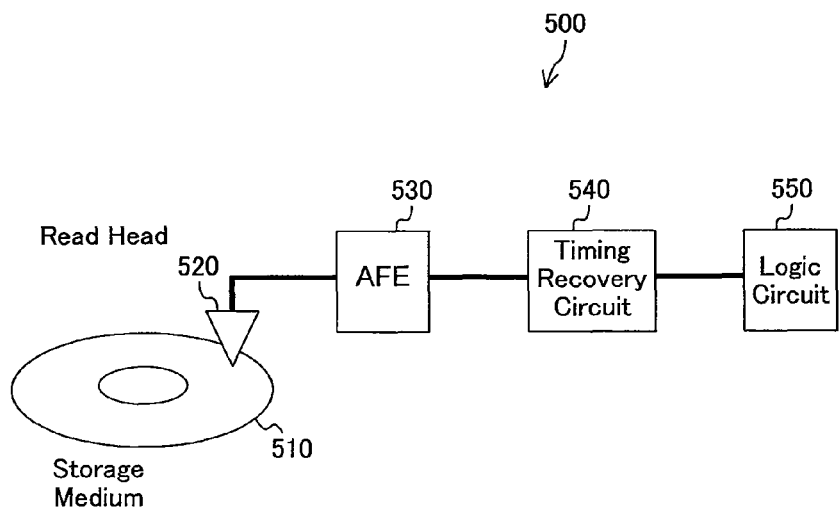
FIG. 25 is a block diagram showing an electronic device 500 according to Embodiment 5.

As shown in FIG. 25, the electronic device 500 includes a storage medium 510, a read head 520, an analog frontend 530 (abbreviated as AFE in FIG. 25), a timing recovery circuit 540 (any of the aforementioned embodiments and variations), and a logic circuit 550.

Information recorded in the storage medium 510 is read by the read head 520 and is subjected to a waveform shaping process in the analog frontend 530 (signal output circuit) before being transferred to the timing recovery circuit 540.

The timing recovery circuit 540 generates synchronous data while performing a phase control process, and transfers the synchronous data to the logic circuit 550. For the read channel, high-speed data reading is required, and in addition, jitter occurs in read data, depending on the tilt, rotational speed or the like of a storage medium. Therefore, the timing recovery circuit of the present invention is preferably used to correctly receive data.

INDUSTRIAL APPLICABILITY

The timing recovery circuit of the present invention advantageously makes it possible to achieve a data receiving process on which the result of phase comparison between received data and a clock is correctly reflected, and is useful as, for example, a timing recovery circuit which latches data received in data communication in synchronization with a clock signal.

The invention claimed is:

1. A timing recovery circuit comprising:
a comparison period determiner configured to detect whether or not a change occurs in received data during a comparison period including a timing at which a rising edge of a reference clock occurs;
a phase determiner configured to determine whether a rising edge of the received data is located before or after the reference clock and determine whether a falling edge of the received data is located before or after the reference clock, and output a first determination signal and a second determination signal indicating results of the respective determinations; and
a synchronous data generator configured to output a signal having a level depending on a result of the detection by the comparison period determiner and an output of the phase determiner, as synchronous data, in synchronization with a synchronization clock.

2. The timing recovery circuit of claim 1, wherein
the received data is a signal varying between a first value and a second value, and
the phase determiner outputs the first determination signal having the first value when a change from the second value to the first value occurs in the received data in time before the rising edge of the reference clock during the comparison period; otherwise, the phase determiner outputs the first determination signal having the second value, and in addition, the phase determiner outputs the second determination signal having the first value when a change from the first value to the second value occurs in the received data in time before the rising edge of the reference clock during the comparison period; otherwise, the phase determiner outputs the second determination signal having the second value.

3. The timing recovery circuit of claim 1, wherein
the received data is a signal varying between a first value and a second value, and
the phase determiner outputs the first determination signal having the first value when the received data has the first value during a period between a start point of the comparison period and the rising edge of the reference clock; otherwise, the phase determiner outputs the first determination signal having the second value, and in addition, the phase determiner outputs the second determination signal having the first value when the received data has the second value during a period between the start point of the comparison period and the rising edge of the reference clock; otherwise, the phase determiner outputs the second determination signal having the second value.

4. The timing recovery circuit of claim 1, wherein
the received data is a signal varying between a first value and a second value, and
the phase determiner outputs the first determination signal having the first value when the received data has the first value during a period between a start point of the comparison period and the rising edge of the reference clock; otherwise, the phase determiner outputs the first determination signal having the second value, and in addition, the phase determiner outputs the second determination signal having the second value when the received data has the first value during a period between the rising edge of the reference clock and an end point of the comparison period; otherwise, the phase determiner outputs the second determination signal having the first value.

5. The timing recovery circuit of claim 1, wherein
the synchronous data generator includes a received data holding unit configured to hold the received data in synchronization with the reference clock, and outputs an output of the received data holding unit as the synchronous data when the comparison period determiner does not detect a change in the received data.

6. The timing recovery circuit of claim 5, wherein
the received data is a signal varying between a first value and a second value, and
the comparison period determiner detects a change from the second value to the first value and a change from the first value to the second value in the received data during the comparison period, and
the synchronous data generator outputs the first determination signal as the synchronous data when the comparison period determiner detects the change from the second value to the first value during the comparison period, and outputs an inverted signal of the second determination signal as the synchronous data when the comparison period determiner detects the change from the first value to the second value during the comparison period.

7. The timing recovery circuit of claim 3, wherein
the comparison period determiner detects a change from the second value to the first value and a change from the first value to the second value in the received data during the comparison period, and
the synchronous data generator outputs the first determination signal as the synchronous data when the comparison period determiner detects the change from the second value to the first value in the received data during the comparison period; otherwise, the synchronous data generator outputs an inverted signal of the second determination signal as the synchronous data.

8. The timing recovery circuit of claim 3, wherein
the comparison period determiner detects a change from the second value to, the first value and a change from the first value to the second value in the received data during the comparison period, and
the synchronous data generator outputs an inverted signal of the second determination signal as the synchronous data when the comparison period determiner detects the change from the first value to the second value in the received data during the comparison period, outputs the first determination signal as the synchronous data when the comparison period determiner detects the change from the second value to the first value in the received data during the comparison period, and when none of the change from the second value to the first value and the change from the first value to the second value occurs in the received data during the comparison period, outputs the first value as the synchronous data if the first determination signal has the first value and the second determination signal has the second value; otherwise, the synchronous data generator outputs the second value as the synchronous data.

9. The timing recovery circuit of claim 2, wherein
the comparison period determiner is configured to hold a start point of the comparison period or a state of the received data at the start point as state information, and
the synchronous data generator outputs the first determination signal as the synchronous data when the change from the second value to the first value occurs in the received data during the comparison period, outputs an inverted signal of the second determination signal as the synchronous data when the change from the first value to the second value occurs in the received data during the comparison period, and outputs the state information as the synchronous data when none of the change from the second value to the first value and the change from the first value to the second value occurs in the received data during the comparison period.

10. The timing recovery circuit of claim 2, wherein
the comparison period determiner is configured to hold states of the received data at a start point and an end point of the comparison period as start point information and end point information, respectively, and hold an inverted version of the received data at the start point of the comparison period as inverted start point information, and
the synchronous data generator outputs the first determination signal as the synchronous data when the change from the second value to the first value occurs in the received data during the comparison period, outputs an inverted signal of the second determination signal as the synchronous data when the change from the first value to the second value occurs in the received data during the comparison period, outputs the end point information as the synchronous data when the start point information is the same as the inverted start point information, and outputs the start point information as the synchronous data when none of the change from the second value to the first value and the change from the first value to the second value occurs in the received data during the comparison period and the start point information is not the same as the inverted start point information.

11. A communication node comprising:
the timing recovery circuit of claim 1; and
a connection port connected to a network,
wherein
the timing recovery circuit receives data via the connection port.

12. A network system comprising:
a plurality of communication nodes of claim 11,
wherein
the communication nodes are connected to each other.

13. An electronic device comprising:
the timing recovery circuit of claim 1; and
a signal output circuit configured to output a signal varying between a first value and a second value,
wherein
the timing recovery circuit receives a signal output by the signal output circuit.

14. The timing recovery circuit of claim 4, wherein
the comparison period determiner detects a change from the second value to the first value and a change from the first value to the second value in the received data during the comparison period, and
the synchronous data generator outputs the first determination signal as the synchronous data when the comparison period determiner detects the change from the second value to the first value in the received data during the comparison period; otherwise, the synchronous data generator outputs an inverted signal of the second determination signal as the synchronous data.

15. The timing recovery circuit of claim 4, wherein
the comparison period determiner detects a change from the second value to the first value and a change from the first value to the second value in the received data during the comparison period, and
the synchronous data generator outputs an inverted signal of the second determination signal as the synchronous data when the comparison period determiner detects the change from the first value to the second value in the received data during the comparison period, outputs the first determination signal as the synchronous data when the comparison period determiner detects the change from the second value to the first value in the received data during the comparison period, and when none of the change from the second value to the first value and the change from the first value to the second value occurs in the received data during the comparison period, outputs the first value as the synchronous data if the first determination signal has the first value and the second determination signal has the second value; otherwise, the synchronous data generator outputs the second value as the synchronous data.

16. The timing recovery circuit of claim 3, wherein
the comparison period determiner is configured to hold a start point of the comparison period or a state of the received data at the start point as state information, and
the synchronous data generator outputs the first determination signal as the synchronous data when the change from the second value to the first value occurs in the received data during the comparison period, outputs an inverted signal of the second determination signal as the synchronous data when the change from the first value to the second value occurs in the received data during the comparison period, and outputs the state information as the synchronous data when none of the change from the second value to the first value and the change from the first value to the second value occurs in the received data during the comparison period.

17. The timing recovery circuit of claim 4, wherein
the comparison period determiner is configured to hold a start point of the comparison period or a state of the received data at the start point as state information, and
the synchronous data generator outputs the first determination signal as the synchronous data when the change from the second value to the first value occurs in the received data during the comparison period, outputs an inverted signal of the second determination signal as the synchronous data when the change from the first value to the second value occurs in the received data during the comparison period, and outputs the state information as the synchronous data when none of the change from the second value to the first value and the change from the first value to the second value occurs in the received data during the comparison period.

18. The timing recovery circuit of claim 3, wherein
the comparison period determiner is configured to hold states of the received data at a start point and an end point of the comparison period as start point information and end point information, respectively, and hold an inverted version of the received data at the start point of the comparison period as inverted start point information, and
the synchronous data generator outputs the first determination signal as the synchronous data when the change from the second value to the first value occurs in the received data during the comparison period, outputs an inverted signal of the second determination signal as the synchronous data when the change from the first value to the second value occurs in the received data during the comparison period, outputs the end point information as the synchronous data when the start point information is the same as the inverted start point information, and outputs the start point information as the synchronous data when none of the change from the second value to the first value and the change from the first value to the second value occurs in the received data during the comparison period and the start point information is not the same as the inverted start point information.

19. The timing recovery circuit of claim 4, wherein the comparison period determiner is configured to hold states of the received data at a start point and an end point of the comparison period as start point information and end point information, respectively, and hold an inverted version of the received data at the start point of the comparison period as inverted start point information, and the synchronous data generator outputs the first determination signal as the synchronous data when the change from the second value to the first value occurs in the received data during the comparison period, outputs an inverted signal of the second determination signal as the synchronous data when the change from the first value to the second value occurs in the received data during the comparison period, outputs the end point information as the synchronous data when the start point information is the same as the inverted start point information, and outputs the start point information as the synchronous data when none of the change from the second value to the first value and the change from the first value to the second value occurs in the received data during the comparison period and the start point information is not the same as the inverted start point information.

* * * * *